US008872538B2

United States Patent
Balog et al.

(10) Patent No.: US 8,872,538 B2
(45) Date of Patent: Oct. 28, 2014

(54) SYSTEMS AND METHODS FOR TEST TIME OUTLIER DETECTION AND CORRECTION IN INTEGRATED CIRCUIT TESTING

(71) Applicant: OptimalTest, Ltd., Nes-zionna (IL)

(72) Inventors: Gil Balog, Jerusalem (IL); Reed Linde, El Dorado Hills, CA (US); Avi Golan, Tel Aviv (IL)

(73) Assignee: Optimal Plus Ltd., Nes-zionna (IL)

( * ) Notice: Subject to any disclaimer, the term of this patent is extended or adjusted under 35 U.S.C. 154(b) by 33 days.

(21) Appl. No.: 13/803,268

(22) Filed: Mar. 14, 2013

(65) Prior Publication Data

US 2013/0193994 A1     Aug. 1, 2013

Related U.S. Application Data

(60) Division of application No. 13/113,409, filed on May 23, 2011, now Pat. No. 8,421,494, which is a division of application No. 12/418,024, filed on Apr. 3, 2009, now Pat. No. 7,969,174, which is a division of application No. 11/646,588, filed on Dec. 28, 2006, now Pat. No. 7,528,622, which is a continuation-in-part of application No. 11/175,026, filed on Jul. 6, 2005, now Pat. No. 7,208,969.

(51) Int. Cl.
*G01R 31/26* (2014.01)
*G01R 31/317* (2006.01)
*G01R 31/28* (2006.01)
*G01R 31/3185* (2006.01)

(52) U.S. Cl.
CPC ........ *G01R 31/2601* (2013.01); *G01R 31/3172* (2013.01); *G01R 31/31707* (2013.01); *G01R 31/2894* (2013.01); *G01R 31/318511* (2013.01)
USPC .................................................. 324/762.02

(58) Field of Classification Search
None
See application file for complete search history.

(56) References Cited

U.S. PATENT DOCUMENTS

| | | |
|---|---|---|
| 3,892,955 A | 7/1975 | Maejima |
| 4,639,664 A | 1/1987 | Chiu et al. |
| 4,916,435 A | 4/1990 | Fuller |
| 5,386,189 A | 1/1995 | Nishimura et al. |
| 5,477,544 A | 12/1995 | Botelho |
| 5,539,325 A | 7/1996 | Rostoker et al. |
| 5,726,920 A | 3/1998 | Chen et al. |
| 5,736,850 A | 4/1998 | Legal |
| 5,996,099 A | 11/1999 | Fournel et al. |
| 6,055,463 A | 4/2000 | Cheong et al. |
| 6,246,250 B1 | 6/2001 | Doherty et al. |
| 6,288,955 B1 | 9/2001 | Shibano et al. |
| 6,345,373 B1 | 2/2002 | Chakradhar et al. |
| 6,366,109 B1 | 4/2002 | Matsushita |
| 6,377,901 B1 | 4/2002 | List et al. |
| 6,574,764 B2 | 6/2003 | Krech et al. |
| 6,618,682 B2 | 9/2003 | Bulaga et al. |
| 6,751,763 B2 | 6/2004 | Cho |
| 6,788,993 B2 | 9/2004 | Beffa |
| 6,792,373 B2 | 9/2004 | Tabor |
| 6,792,386 B2 | 9/2004 | Dobson |
| 6,842,022 B2 | 1/2005 | Khoche |

(Continued)

FOREIGN PATENT DOCUMENTS

| | | |
|---|---|---|
| JP | 2002/311775 | 10/2002 |
| JP | 2003/197697 | 7/2003 |

*Primary Examiner* — Paresh Patel
(74) *Attorney, Agent, or Firm* — Occhiuti & Rohlicek LLP

(57) ABSTRACT

Methods and systems for semiconductor testing are disclosed. In one embodiment, devices which are testing too slowly are prevented from completing testing, thereby allowing untested devices to begin testing sooner.

18 Claims, 13 Drawing Sheets

(56) References Cited

U.S. PATENT DOCUMENTS

| | | |
|---|---|---|
| 6,936,889 B2 | 8/2005 | Koga et al. |
| 6,937,049 B2 | 8/2005 | Wuidart et al. |
| 6,948,149 B2 | 9/2005 | Goodwin |
| 6,988,232 B2 | 1/2006 | Ricchetti et al. |
| 7,013,231 B2 | 3/2006 | Kritt |
| 7,197,417 B2 | 3/2007 | Pramanick et al. |
| 7,208,969 B2 | 4/2007 | Golan |
| 2004/0044938 A1 | 3/2004 | Heo |
| 2005/0278597 A1 | 12/2005 | Miguelanez et al. |
| 2006/0085155 A1 | 4/2006 | Miguelanez et al. |
| 2006/0100844 A1 | 5/2006 | Yang et al. |
| 2006/0106555 A1 | 5/2006 | Voorakaranam et al. |

SYSTEMS AND METHODS FOR TEST TIME OUTLIER DETECTION AND CORRECTION IN INTEGRATED CIRCUIT TESTING

CROSS REFERENCE TO RELATED APPLICATIONS

This application is a divisional application of U.S. application Ser. No. 13/113,409 filed on May 23, 2011, which is a divisional application of U.S. application Ser. No. 12/418,024 filed on Apr. 3, 2009, which is a divisional application of U.S. application Ser. No. 11/646,588 filed on Dec. 28, 2006, which is a continuation in part of U.S. application Ser. No. 11/175,026 filed on Jul. 6, 2005. The applications are hereby incorporated by reference herein.

FIELD OF THE INVENTION

This invention relates to semiconductor integrated circuit testing.

BACKGROUND OF THE INVENTION

Some terms used in semiconductor testing industry will now be illuminated. The definitions are presented informally to aid in the understanding of the reader and therefore should not be considered binding:

An integrated circuit (IC) is a small electronic device made out of a semiconductor material.

A wafer is a thin slice of semiconductor material, such as silicon, upon which microcircuits are constructed by doping (for example, diffusion or ion implantation), etching, and deposition of various materials.

A wafer is usually made up of many single units also called dice (one unit=die, two or more units=dice or dies). After the fabrication process is completed, the wafer will be cut during the assembly process and each die may be connected into a package using aluminum (or occasionally gold) wires which are welded to pads, usually found around the edge of the die.

There are various testing stages. For example, sort (also known as wafer probe) is done while the units are still at wafer level. For example, final test is done after the units have been packaged.

A "touchdown" is the term used when the interface unit (for example at Sort—probe-card or for example at Final Test—contactor or load-board) "touches" the unit under test.

Note that the term "device" may have many meanings in semiconductor testing, including integrated circuits, product type, wafer or die and the meaning should be construed based on the context.

The term "lot" may also have more than one meaning in semiconductor testing. Typically although not necessarily in fabrication, E-test (Electrical Test or Parametric Electrical Test), and sort test, a (fabrication) "lot" refers to a plurality of wafers that were manufactured at the same time, whereas in burn in, final test, and system validation, a (n assembly) "lot" typically although not necessarily refers to a plurality of units that were tested in the same batch.

The testing of a group of integrated circuit (IC) devices may be performed by various general methods. At the highest level, these methods may be distinguished by whether they involve testing devices a single one at a time i.e. "sequentially", or whether testing occurs on several at the same time, i.e. in "parallel". Complex products such as CPUs are typically tested a single device at a time, while memory devices are most often tested in parallel. The grouping of devices being tested together in a parallel test configuration at the wafer-sort operation is often referred to informally as a "touchdown".

A manufacturing test flow for a set of IC devices will often be composed of multiple successive test operations, also sometimes referred to as "test socketings" or "test sockets". Within each test operation, the test program for that particular test operation will typically be executed under control of an automated test equipment (ATE) system, often aided by built-in self-test (BIST) circuits included on-chip. The test program includes at least one test executed in order to determine if the device under test is good or bad. The tests in the test program are typically executed one at a time on a device, but this is not binding. Each test within a test program has a characteristic test time. The sum of the test times for the set of tests within a test program for a given device is the total device test time of that device in that test operation.

The minimum test time required to execute an individual test within a test program on a device will naturally vary somewhat from one device to another. Normally, variation in the minimum test time required to execute any given test is the result of the natural variation in the physical characteristics of IC sub-components, such as transistors, resistors, capacitors, making up the IC circuits. The variation is ultimately the result of less-than-perfect fabrication capabilities, causing structures within the microcircuits such as line-width, film-thickness and the like to vary somewhat within an IC, as well as varying from IC to IC, and from fabrication lot to fabrication lot. Such variation is generally unavoidable in IC fabrication processes, and results in a distribution of electrical performance in a population of finished IC devices that is usually "normal", i.e. Gaussian, in nature. IC test conditions and test algorithms are sometimes designed to accommodate this normal variation, typically either running tests slowly enough to allow even the slowest performing devices to keep up with the test operations, or employing adaptive test algorithms that adjust the speed of test according to inherent device performance.

As mentioned, the above source of test-time variation is intrinsic to IC fabrication technology. Moreover, the performance of any given device can also be greatly degraded by faulty fabrication processing, potentially creating or depositing discrete defects within the circuits of the device or skewing the dimensions of IC sub-component structures, leading to aberrant circuit behavior. In most cases, such issues will actually cause the finished IC device to be non-functional, resulting in test failure. However, if the issue is relatively minor the device may remain functional, and will simply exhibit highly degraded electrical performance. In this case, such a device may appear as an "outlier" in the overall test-time distribution of the population of IC devices that is otherwise Gaussian, testing much more slowly than the group of normal devices.

There will now be described the commonly used industry practices of sequential and parallel IC testing.

In sequential testing, the total test time for a set of devices is simply the sum of the total test times for the individual devices in the group. This is illustrated in FIG. 1, where the total test time of the twelve tested devices equals 260 seconds (i.e. 20 for device A1+20 for device B1+20 for device C1+20 for device D1+20 for device A2+20 for device B2+20 for device C2+20 for device D2+30 for device A3+20 for device B3+20 for device C3+20 for device D3). Note that since each device is tested independently of the others, individual device test times may be allowed to vary, for example in FIG. 1 device C2 and device A3 each have a test time of 30 seconds compared to test times of 20 seconds each for the other devices. Alternatively, if testing is done in such a way that the tests within the test program are always executed slowly enough to accommodate even the slowest normal devices encountered, test-time will be constant. Either way, the total test-time for a set of devices will simply be the sum of the test-times of the individual devices.

If testing is done on a group of devices in parallel and in a synchronized fashion, all devices within the group will complete testing at the same time. This is because in a synchronous test environment the tester regulates test operations such that each test in the test program occurs simultaneously and synchronously on all devices being tested in parallel. In this case, the tester hardware driving signals are actually shared between all devices tested in parallel. In order to ensure that all normal devices within the group can keep up with the synchronized test execution imposed by the ATE, the rate of testing is selected such that even the slowest normal devices that meet specifications are accommodated. Devices are no longer tested independently; testing instead occurs between devices in lockstep. When the testing of the group of devices within the parallel group is complete, testing will progress to the next parallel group (i.e. to the next group of devices to be tested in parallel).

In such a synchronous parallel test environment, the total test time for a set of devices is the sum of the total test times for the individual parallel groups, with identical test-time for each device and therefore for each parallel group. This is illustrated in FIG. 2 where the same group of 12 devices which were tested sequentially in the example of FIG. 1 is tested instead in the example of FIG. 2 in a synchronous parallel test environment with three parallel groups of four devices each successively tested. The test time for each device (and therefore for each parallel group) is limited by the test time of the slowest device from any of the parallel groups (i.e. from the group of devices being tested), in this example 30 seconds (recall that 30 seconds was the test time of slowest devices C2 or A3—see FIG. 1). Therefore the total test time is 90 seconds (i.e. 30 seconds for each parallel group×3 parallel groups). The benefit of such a parallel test operation over a sequential one is that in approximately the same amount of time required to test one device all the devices in the parallel group can be tested, effectively increasing the testing capacity.

However, if testing of the group of devices within a parallel group is not forced to be synchronous (i.e. is asynchronous), the test time of each independent device within the group may in some cases vary. An example of such an environment would be one involving on-chip Built-In-Self-Test (BIST) methods, allowing independent execution of test algorithms for each device. Because in this case the execution paths of test algorithms may vary between individual devices, variable test execution time between devices is possible.

In such an asynchronous parallel test configuration the test-time for each parallel group is determined by the device in that parallel group with the longest test time ("the weakest link in the chain"). For example, if there are 4 devices being tested in parallel and 3 of them complete testing in less than 20 seconds, while the fourth device requires 30 seconds to complete testing, then the overall test time of the parallel group will be 30 seconds. Only after all 4 devices in the parallel group have completed testing can tester resources be redeployed to the next (untested) group of 4 devices. In this example, although the parallel test arrangement allows the 4 devices to complete testing much more quickly than they would if tested sequentially, the slow fourth device adds an extra 50% to the parallel group test time that would be required if the slow device were eliminated from the group.

This is illustrated in FIG. 3, where the same group of devices tested in a sequential or parallel synchronous test environment in the example of FIG. 1 or FIG. 2 respectively are instead tested in an asynchronous parallel testing environment. The first parallel group in FIG. 3 has a 20 second test time for each of the four included devices and therefore the test time of the first group is 20 seconds. The second parallel group in FIG. 3 has a 20 second test time for each of the three included devices and a 30 second test time for the fourth included device (device C2) and therefore the test time of the second group is 30 seconds. Similarly, the third parallel group in FIG. 3 has a 20 second test time for each of three included devices and a 30 second test time for the fourth included device (device A3) and therefore the test time for the third group is 30 seconds. Total test time is therefore 80 seconds (i.e. 20 seconds for the first parallel group+30 seconds for the second parallel group+30 seconds for the third parallel group)

The problem of slow device test time is exacerbated by the trend in IC test technology towards higher levels of test parallelism. As the number of devices included in a parallel group increases, with advancing IC manufacturing and test technology, so does the probability that at least one of those devices will exhibit abnormally slow test-time. This is because even at the low defect density at which random discrete defects occur within modern IC fabrication processes, the probability that at least one IC device within a group of devices to be tested contains a test-time limiting defect is significant, increasing for example exponentially with an increasing number of devices in the parallel group, if Poisson statistics are applicable. For example, if 1% of individual devices contain fabrication defects causing them to be abnormally slow to test, the probability of finding such a device in a parallel test group sized at 16 devices is fairly low, while the probability of finding such a device in a parallel test group sized at 256 devices is highly likely. For the conditions given in this example, assuming binomial statistics, the probability of finding an abnormally slow device in the x16 grouping is only 15%, while for the x256 grouping the probability is 92%. For the larger grouping, in fact, the test time of every parallel group is virtually assured to be limited by aberrant devices.

As illustrated above, even when the fraction of abnormally slow-to-test devices is relatively low, the aberrant devices may have a significant impact on the overall test time of the test operation, especially in a highly parallel test environment. Further, those skilled in the art will recognize that there is frequently a correlation between devices with abnormal behavior during test and the likelihood of ultimately either failing test operations or exhibiting reliability or performance problems in end-user product applications. Therefore, test capacity in an IC test operation may be significantly limited by abnormal devices, which may individually have little or no value, or in a worse case may in fact contribute to product line reliability or performance issues.

SUMMARY OF THE INVENTION

According to the present invention, there is provided a method of semiconductor testing comprising: while a test program is being applied to a semiconductor device, deciding that the device is testing too slowly and that based on a yield criterion the device is to be prevented from completing the test program; and preventing the device from completing the test program; wherein after the device has been prevented from completing the test program and if there is at least one remaining untested semiconductor device, the test program is applied to at least one of the remaining untested semiconductor devices.

According to the present invention, there is also provided a method of semiconductor testing comprising: while a test program is being applied to the semiconductor device, recognizing the semiconductor device as a candidate for test aborting because the device is testing too slowly based on a customized value for a test time parameter; deciding whether to abort testing on the candidate; and preventing the candidate from completing the test program, if the decision is to abort; wherein after the device has completed the test program or has been prevented from completing the test program and if there is at least one remaining untested semiconductor device, the test program is applied to at least one of the remaining untested semiconductor devices.

According to the present invention, there is further provided a method of semiconductor testing comprising: while a test program is being applied to the semiconductor device, recognizing the semiconductor device as a candidate for test aborting because the device is testing too slowly based on data relating to a plurality of tests in the test program; deciding whether to abort testing on the candidate; and preventing the candidate from completing the test program, if the decision is to abort; wherein after the device has completed the test program or has been prevented from completing the test program and if there is at least one remaining untested semiconductor device, the test program is applied to at least one of the remaining untested semiconductor devices.

According to the present invention, there is provided a method of semiconductor testing comprising: while a test program is being applied to a semiconductor device in parallel with at least one other semiconductor device, recognizing the semiconductor device as a candidate for test aborting because the device is testing too slowly compared to at least one other device being tested in parallel; deciding whether to abort testing on the candidate; and preventing the candidate from completing the test program, if the decision is to abort; wherein after the device has completed the test program or has been prevented from completing the test program and if there is at least one remaining untested semiconductor device, the test program is applied to at least one of the remaining untested semiconductor devices.

According to the present invention, there is also provided a system for semiconductor testing, comprising: an algorithm engine, external to a tester, configured to recognize that a device is testing too slowly and that a test program should be aborted; the algorithm engine configured to indicate to a tester to abort the test program on the semiconductor device.

According to the present invention, there is further provided a computer program product comprising a computer useable medium having computer readable program code embodied therein for semiconductor testing, the computer program product comprising: computer readable program code for causing the computer, while a test program is being applied to a semiconductor device, to decide that the device is testing too slowly and that based on a yield criterion the device is to be prevented from completing the test program; and computer readable program code for causing the computer to prevent the device from completing the test program; wherein after the device has been prevented from completing the test program and if there is at least one remaining untested semiconductor device, the test program is applied to at least one of the remaining untested semiconductor devices.

According to the present invention, there is provided a computer program product comprising a computer useable medium having computer readable program code embodied therein for semiconductor testing, the computer program product comprising: computer readable program code for causing the computer, while a test program is being applied to the semiconductor device, to recognize the semiconductor device as a candidate for test aborting because the device is testing too slowly based on a customized value for a test time parameter; computer readable program code for causing the computer to decide whether to abort testing on the candidate; and computer readable program code for causing the computer to prevent the candidate from completing the test program, if the decision is to abort; wherein after the device has completed the test program or has been prevented from completing the test program and if there is at least one remaining untested semiconductor device, the test program is applied to at least one of the remaining untested semiconductor devices.

According to the present invention, there is also provided a computer program product comprising a computer useable medium having computer readable program code embodied therein for semiconductor testing, the computer program product comprising: computer readable program code for causing the computer while a test program is being applied to the semiconductor device, to recognize the semiconductor device as a candidate for test aborting because the device is testing too slowly based on data relating to a plurality of tests in the test program; computer readable program code for causing the computer to decide whether to abort testing on the candidate; and computer readable program code for causing the computer to prevent the candidate from completing the test program, if the decision is to abort; wherein after the device has completed the test program or has been prevented from completing the test program and if there is at least one remaining untested semiconductor device, the test program is applied to at least one of the remaining untested semiconductor devices.

According to the present invention, there is further provided a computer program product comprising a computer useable medium having computer readable program code embodied therein for semiconductor testing, the computer program product comprising: computer readable program code for causing the computer, while a test program is being applied to a semiconductor device in parallel with at least one other semiconductor device, to recognize the semiconductor device as a candidate for test aborting because the device is testing too slowly compared to at least one other device being tested in parallel; computer readable program code for causing the computer to decide whether to abort testing on the candidate; and computer readable program code for causing the computer to prevent the candidate from completing the test program, if the decision is to abort; wherein after the device has completed the test program or has been prevented from completing the test program and if there is at least one remaining untested semiconductor device, the test program is applied to at least one of the remaining untested semiconductor devices.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EXEMPLARY EMBODIMENTS

Figure 1:
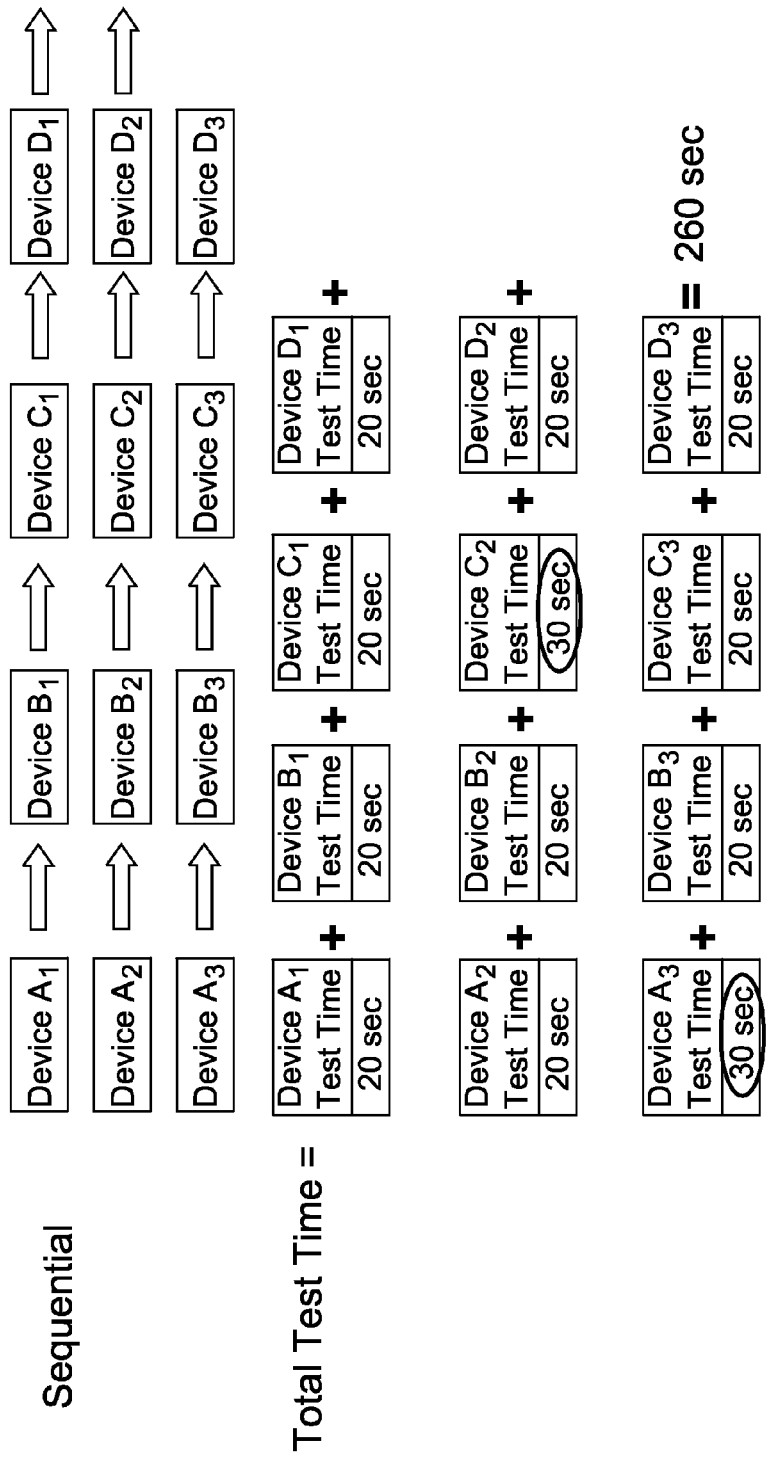
FIG. 1 is an illustration of an example of total test time in a sequential test environment for a group of devices.
Figure 2:
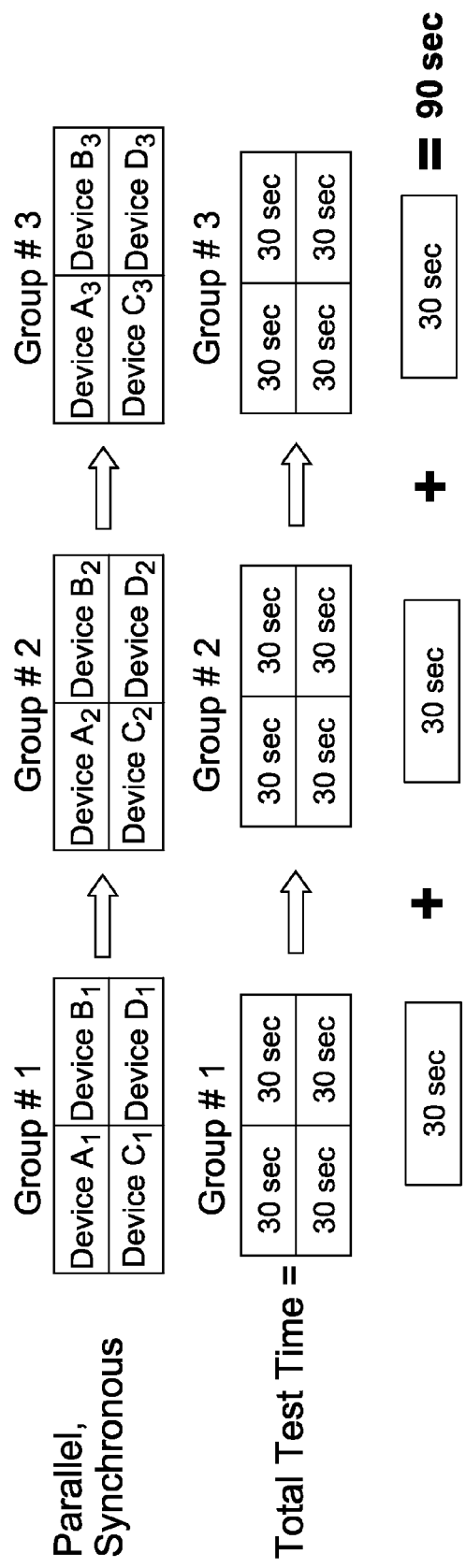
FIG. 2 is an illustration of an example of total test time in a synchronous parallel test environment for the same group of devices as in FIG. 1.
Figure 3:
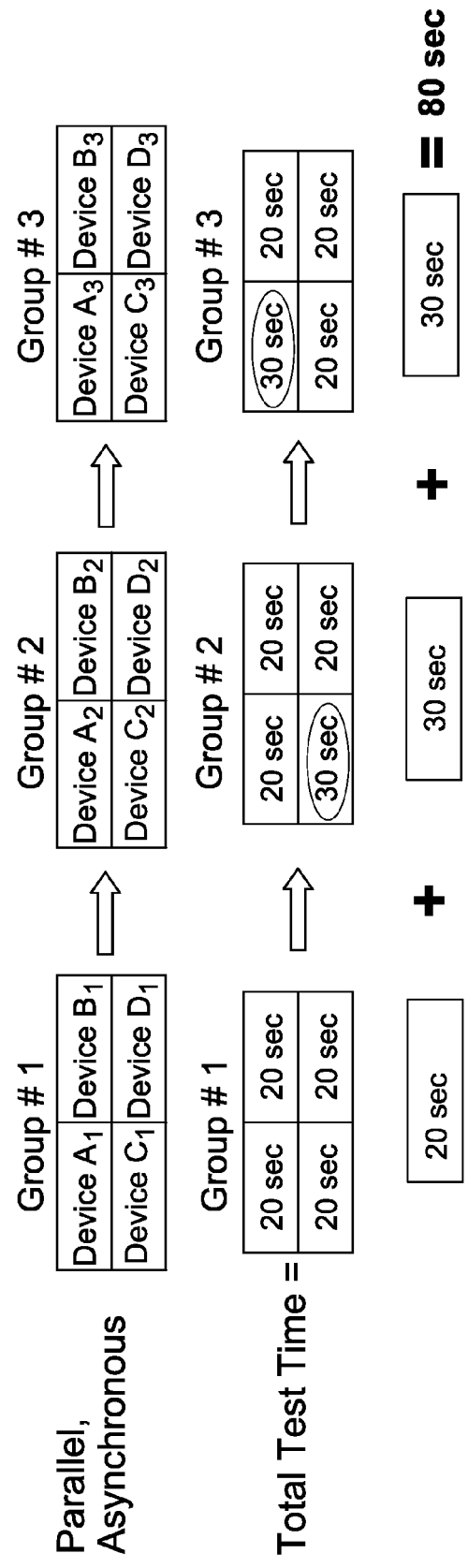
FIG. 3 is an illustration of an example of total test time in an asynchronous parallel test environment for the same group of devices as in FIG. 1.

Described herein are embodiments of the current invention for semiconductor testing, including methods and systems that will automatically and in "real-time" identify devices exhibiting abnormally long test time (also termed below as too-slow testing devices, devices testing too slowly, abnormal devices or aberrant devices) during the course of testing. The forced early termination of the testing of such devices is facilitated under circumstances which depend on the embodiment, allowing test operations to progress sooner to the next untested device or group of devices to improve a test operation's overall efficiency.

Test capacity is defined as the volume of material (i.e. number of devices) that can be processed through a factory test operation within a fixed period of time given the available test equipment and test times for that operation. Assuming that the available test equipment remains unchanged, increased test capacity (for example through the lowering of test times) implies increased efficiency. The test interval is defined as the period of time in which a fixed volume of material (i.e. fixed number of devices) can be processed through a factory test operation given the available test equipment and test times for that operation. Assuming that the available test equipment remains unchanged, decreased test interval (for example through the lowering of test times) implies increased efficiency. In the description below, the term improving test efficiency should be understood to refer to increasing test capacity and/or reducing the test interval, as appropriate, assuming the same available test equipment (i.e. without changing the available test equipment). It should be understood by the reader that in some cases it may be appropriate to be more lenient with regard to test efficiency (i.e. to take the chance that test efficiency may not be maximized), for example in order to focus more on maximizing yield instead (i.e. maximize the potential number of passing devices), as will be described in more detail below.

The term "test program" as used herein should be understood to refer to at least one test which is executed on a semiconductor device in order to determine whether the device under test is good (i.e. passes) or is bad (i.e. fails).

As used herein, the phrase "for example," "such as" and variants thereof describing exemplary implementations of the present invention are exemplary in nature and not limiting.

Reference in the specification to "one embodiment", "an embodiment", "some embodiments", "another embodiment", "other embodiments" or variations thereof means that a particular feature, structure or characteristic described in connection with the embodiment(s) is included in at least one embodiment of the invention. Thus the appearance of the phrase "one embodiment", "an embodiment", "some embodiments", "another embodiment", "other embodiments", or variations thereof is not necessarily referring to the same embodiment(s).

Systems and methods described herein are not limited to test operations for particular types of IC devices, and may be applied to CPU's, memory, analog, mixed-signal devices, and/or any other IC devices. For example, in one embodiment testing of the IC devices may occur through use of automated electronic test equipment, potentially in combination with BIST (Built-In Self-Test) circuitry. Also, there are no limitations on the type of test operation to which systems and methods described herein can be applied. For example, depending on the embodiment, the systems and methods described herein can benefit wafer-level sort operations, strip-test operations, final test package-level test operations, multi-chip-package module-level test operations, and/or any other test operations. Depending on the embodiment, systems and methods described herein can be applied to any IC test environment, including inter-alia: sequential and/or parallel (synchronous and/or asynchronous) test environments.

The present invention is primarily disclosed as a method and it will be understood by a person of ordinary skill in the art that an apparatus such as a conventional data processor incorporated with a database, software and other appropriate components could be programmed or otherwise designed to facilitate the practice of the method of the invention.

Unless specifically stated otherwise, as apparent from the following discussions, it is appreciated that throughout the specification discussions, utilizing terms such as, "processing", "computing", "calculating", "determining", "applying", "associating", "providing", "deciding", "checking" or the like, refer to the action and/or processes of any combination of software, hardware and/or firmware. For example, in one embodiment a computer, computing system, processor or similar electronic computing device may manipulate and/or transform data represented as physical, such as electronic, quantities within the computing system's registers and/or memories into other data, similarly represented as physical quantities within the computing system's memories, registers or other such information storage, transmission or display devices.

Embodiments of the present invention may use terms such as, processor, computer, apparatus, system, sub-system, module, unit, engine, etc, (in single or plural form) for performing the operations herein. These terms, as appropriate, refer to any combination of software, hardware and/or firmware configured to perform the operations as defined and explained herein. The module(s) (or counterpart terms specified above)

may be specially constructed for the desired purposes, or it may comprise a general purpose computer selectively activated or reconfigured by a computer program stored in the computer. Such a computer program may be stored in a computer readable storage medium, such as, but not limited to, any type of disk including optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, any other type of media suitable for storing electronic instructions that are capable of being conveyed via a computer system bus.

The process(es)/methods/module(s) (or counterpart terms specified above) and display(s) presented herein are not inherently related to any particular computer or other apparatus, unless specifically stated otherwise. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Figure 4:
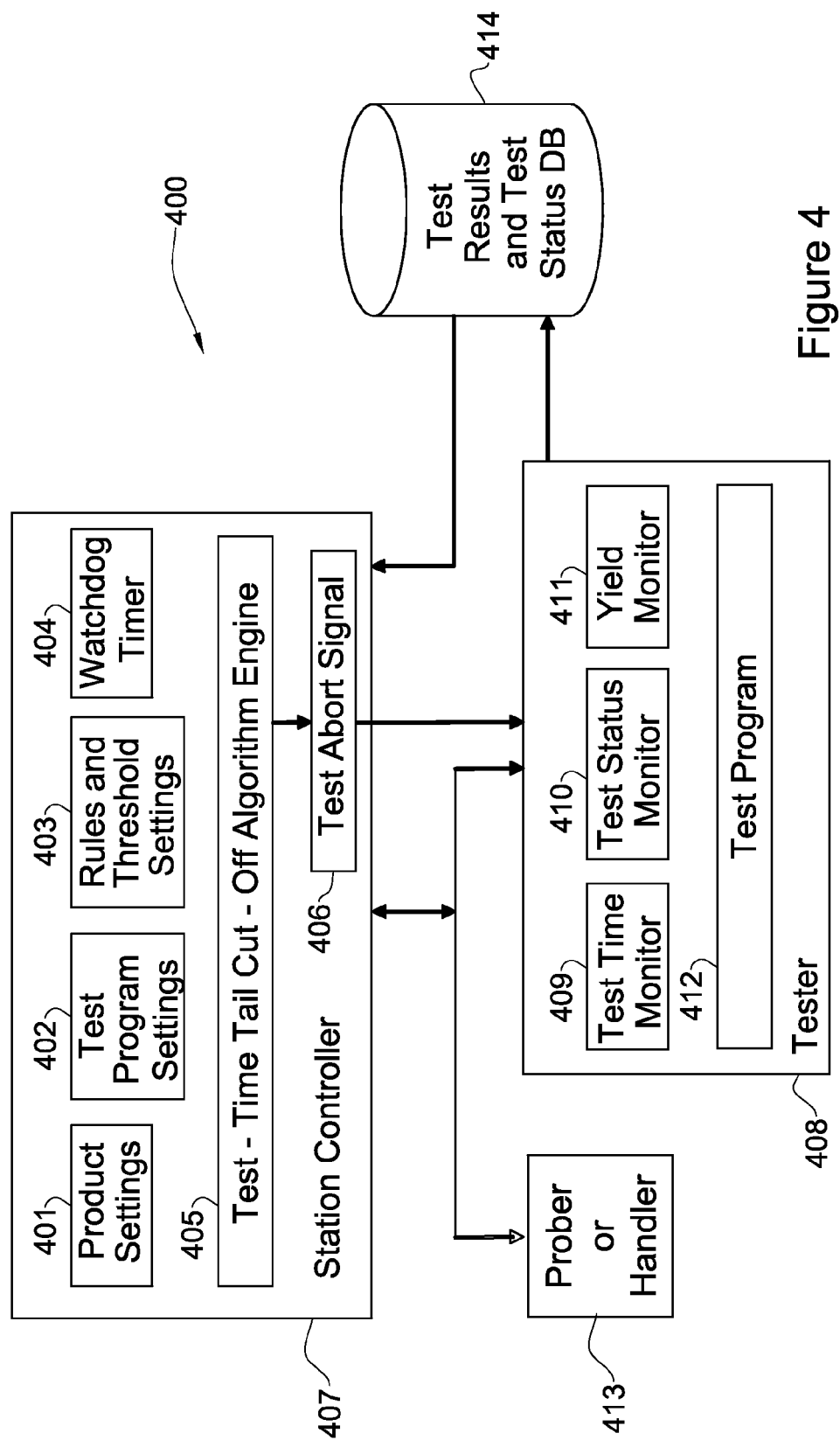
FIG. 4 is a block diagram of a system for semiconductor testing, supporting the aborting of slow testing devices, according to an embodiment of the present invention.

FIG. 4 illustrates a general system architecture 400 in accordance with an embodiment of the invention. Each module in FIG. 4 can be made up of any combination of software, hardware and/or firmware that performs the functions as defined and explained herein. The modules in FIG. 4 may be centralized in one location or dispersed over more than one location. In other embodiments of the invention, the system may comprise fewer, more, and/or different modules than those shown in FIG. 4. In other embodiments of the invention, the functionality of system 400 described herein may be divided differently into the modules of FIG. 4. In other embodiments of the invention, the functionality of system 400 described herein may be divided into fewer, more and/or different modules than shown in FIG. 4 and/or system 400 may include additional or less functionality than described herein. In other embodiments of the invention, one or more modules shown in FIG. 4 may have more, less and/or different functionality than described.

As shown in FIG. 4, system 400 includes a Station Controller 407, a Test Results and Test Status Database 414, a Tester 408 and a Prober or Handler 413. In some embodiments, one or more of elements station Controller 407, Test Results and Test Status Database 414, Tester 408, and Prober or Handler 413 are connected to one another via a local area network LAN and/or a bus. For example, in one of these embodiments, station controller 407 and database 414 may be integrated into a single computer and/or into tester 408.

In another embodiment there may be a plurality of station controllers 407, for example two station controllers, with one station controller 407 dedicated to tester 408 and the other station controller 407 dedicated to prober/handler 413. For simplicity of description it is assumed below that there is only one station controller 407.

As illustrated in FIG. 4, the Station Controller 407 includes a product settings module 401, a test program settings module 402, a rules and threshold setting module 403, a watchdog timer module 404, a test-time tail cut-off algorithm engine 405, and a test abort signal generation module 406. The product settings module 401, for example, may include various product-specific settings. In one embodiment, one of the product settings is a specification of which devices are grouped together for each parallel group within a parallel test wafer-sort operation. In this embodiment, the wafer map, the position on the wafer of each parallel group, the order in which these parallel groups are tested, and the specification of which devices are grouped together for each parallel group are product-specific, and are specified as such. In another embodiment involving wafer-sort operations, the product settings module 401 includes a specification of groupings of devices on a wafer according to defined regions or sets of locations within the wafer with similar test-time characteristics, to be treated distinctly, each with its own set of rules and threshold setting parameters or limits. For example, if normal devices in the center of the wafer exhibit faster intrinsic test-times than devices at the edge, then it may be desirable to distinguish between these two regions, allowing a distinct and different set of test-time limits, or potentially even differing control algorithms, between the wafer center and the wafer edge.

The test program setting module 402, for example, includes information specific to each of one or more test programs. The test-program-specific content stored here may include a specification of test sequences within a test program, and a database of the values for typical test test-times and for the total test-time of the test operation. Typically, the test sequences and typical test execution times are dependent on the content of any given test program, and therefore correspond to the version of the test program being used.

The rules and threshold settings module 403, for example, includes information on which test-time cut-off algorithm(s) should be executed in conjunction with execution of any given test program. Rules and threshold settings 403 may also or instead include test-time limit (maximum and/or minimum) levels, and specific operational conditions under which a device is to be designated as aberrant, i.e. as having an abnormally long test time. Rules and threshold settings 403 may instead or in addition include yield limits and specific operational conditions, for example specifying under which conditions abnormally long device testing would not be interrupted, so as to not reduce yield (i.e. under which conditions the testing of too-slow testing devices would not be interrupted, potentially allowing those devices to become passing devices).

The three modules 401, 402, and 403 described above, and shown as included within Station Controller 407 in FIG. 4 may, for example, have configurations thereof set from an external repository of configuration data containing a multitude of potential settings, corresponding to the various combinations of product, test program, and rule/threshold settings that may be used in manufacturing operations. Such an external repository would serve as the source of the particular configuration data to execute the test-time tail cut-off algorithm on any given product being tested. In such a manufacturing environment, those product-specific data would be passed from the external repository to Station Controller 407 to be utilized real-time by the test-time tail cut-off algorithm engine 405 for testing the particular product-under-test.

The watchdog timer module 404, for example, provides the station controller 407 with the ability to initiate timing in parallel and in synchronization with for example test program execution and/or specific test(s) execution, terminating when the watchdog timer exceeds the maximum allowed test-time. In one embodiment, watchdog timer module 404 is external and independent of tester 408. In one embodiment, when timing has terminated, the test-time tail cut-off algorithm engine 405 is signaled by the watchdog timer module 404 to begin evaluating the test time tail cut off algorithm, for example based on the various monitor data from tester 408 at that point in time. In an alternative embodiment, watchdog timer module 404 may additionally or alternatively trigger to test time tail cut-off algorithm engine 405 to stop evaluating the test time tail cut off algorithm. In an alternative embodiment to that illustrated in FIG. 4, watchdog timer module 404 may reside on tester 408. For example in some cases if the testing is occurring internally within each device through BIST (Built-In Self-Test) operations tester-based hardware may be used for watchdog timer 404. As another example, if tester 408 included multiple independent electronic circuits, then in some cases testing may be driven from one or more of the circuits while one or more of the other circuits may be used in parallel to generate the watchdog timer signal. In an alternative embodiment to that illustrated in FIG. 4, watchdog timer module 404 may reside within a separate subordinate computer system in communication with station controller 407 and/or tester 408. In an alternative embodiment to that illustrated in FIG. 4, watchdog timer module 404 may be omitted, for example if algorithm engine 405 implements an algorithm which does not require a watchdog timer—see below where various algorithms are discussed.

In one embodiment test time tail cut-off algorithm engine 405 has access to the various monitor data produced real-time during testing. In this embodiment test-time tail cut-off algorithm engine 405 includes the functionality to execute the defined test-time tail cut-off algorithms. For example algorithm engine 405 may evaluate in "real time" the various monitor data from tester 408, residing in the test results and test status DB 414, to determine whether devices under test are, or are not, consistent in their test time with normal devices (i.e. whether devices have or have not aberrantly long test time). Continuing with the example, algorithm engine 405 may utilize test time monitor data, test status monitor data and/or yield monitor data, to identify devices forming a test-time tail that require test termination, as will be described in more detail below. In one embodiment, algorithm engine 405 may be included in the central processing unit CPU of station controller 407. In an alternative embodiment to that illustrated in FIG. 4, test-time tail cut-off algorithm engine 405 may physically reside and be executed within other system elements, for example in tester 408 (for example in the CPU of tester 408), or within a separate subordinate CPU or computer system in communication with CPU of test station controller 407 and/or in communication with the CPU of tester 408.

The usage of the term "test time tail" as used herein should be understood to refer to a period of test time for a device which is considered to be beyond the desirable test time, as determined by various algorithms described below. Therefore "test time tail cut off" refers to preventing some or all of the non-desirable period of testing to take place, i.e. by not allowing the too-slow testing device to complete the test program. In one embodiment, the "test time tail" of an aberrant device whose test time is beyond that of a normal device is determined based on the overall statistical distribution of test times formed by the population of all devices being tested. Therefore in this embodiment "test time tail cut off" also refers to the termination of testing of such aberrant devices before they have completed test program execution, effectively truncating the overall statistical distribution of test times by "cutting off" the highest test time values (i.e., those values that would have otherwise resulted from allowing such aberrant devices to complete testing).

The test abort signal module 406, for example, represents an interface, between the test-time tail cut-off algorithm engine 405 and tester 408, providing the means for the test-time tail cut-off algorithm engine to initiate test program termination of any device under test determined to fail a test-time tail cut-off algorithm. For example, "test abort signal" may be considered an interrupt mechanism by which the testing of any device can be terminated prior to completion of the full test program, based on the results of analysis by the test-time tail cut-off algorithm engine. Continuing with the example, termination may be initiated when the test-time tail cut-off algorithm engine 405 issues a test abort signal 406, which may be relayed to tester 408. Still continuing with the example, upon receipt of the test abort signal, tester 408 may in one embodiment follow a test termination sequence in which electronic signals originating on tester 408 which drive the device under test and/or device power supplies are applied to abort the testing. In one embodiment, if algorithm engine 405 resides on station controller 407, abort signal 406 may be relayed by station controller 407 CPU to tester 408, or in another embodiment if algorithm engine 405 resides on a subordinate CPU or computer system in communication with tester 408, abort signal 406 may be relayed by the subordinate CPU or by computer system in communication with tester 408 to tester 408. As another example, if algorithm engine 405 resides on tester 408, the abort signal may in some cases comprise a section of the test program detailing conditions under which the test program is to be terminated, resulting in generation of the test termination sequence, wherein in one embodiment electronic signals originating on tester 408 which drive the device under test and/or device power supplies are applied to abort the testing.

As illustrated in FIG. 4, station controller 407, is in communication with tester 408, handling equipment 413, and test results and test status database 414. In one embodiment, SC 407 comprises a conventional data processor.

As illustrated in FIG. 4, tester 408 incorporates a test program 412. In one embodiment, test program 412 consists of one or more tests whose individual execution status, test-times, and test results are logged by the tester 408 as testing progresses from the beginning of the test program through the end, test data being transmitted by the tester 408 to the station controller 407 (for example to algorithm engine 405) and/or to the test results database 414 as testing progresses. In one embodiment, one or more of these data items are logged by the tester 408 as a response to a request made by the station controller 407, initiated by an algorithm control engine 405 data request. In one embodiment, one or more of these data items are logged by the tester 408 as a result of a test-synchronized timing signal from watchdog timer 404 running on either the tester 408 within a separate subordinate computer system in communication with station controller 407 and/or tester 408, or as illustrated in FIG. 4 on the station controller 407. In one embodiment test program 412 may have test execution aborted by the tester 408 to force early device test termination before testing of the device is complete, initiated from the algorithm control engine 405 to tester 408, for example via a station controller 407 interface (test abort signal 406) assuming that algorithm engine 405 resides in station controller as illustrated in FIG. 4.

In some embodiments of the invention, test program 412 may include hard coded limits on execution times for individual tests within a test program. In one of these embodiments, if the limit is exceeded for a test, the testing may be stopped for that device or the test operation may be completely halted to allow any problem to be addressed. In one of these embodiments, the specific operational conditions under which a device is considered to be aberrant (i.e. too slow testing) by algorithm engine 405, are more stringent than any hard coded limit—i.e. the algorithm engine may find a device to be too slow testing even though no limits in the test program have been exceeded. For example, in some cases the maximum allowed time for executing a test examined by algorithm engine 405 may be less than the hard coded limit on execution time for the same test which is hard coded in the test program.

As illustrated in FIG. 4, tester 408 also includes test time monitor module 409, test status monitor 410, and/or yield monitor 411, providing monitor data relevant to the execution of test operation. In one embodiment, the monitor data is passed from tester 408 to database 414. Algorithm engine 405 then accesses the monitor data from database 414 to be used in evaluating the algorithms as described herein. In another embodiment monitor data may directly pass from tester 408 to algorithm engine 405.

In one embodiment, test time monitor 409 generates data on the total execution time of the test program, and in another embodiment test time monitor 409 may also or instead generate data on the execution time of the individual tests within the test program. For example, test time monitor 409, may log actual test execution time for each test in the test program for each device being tested, and/or may log actual total test execution time for each device being tested, so that the execution times may be used by test-time tail cut-off algorithm engine 405. In this example, test-time data may be updated test-by-test and stored in system memory (for example local memory at tester 408, local memory at station controller 407 and/or in database 414) as testing progresses through the test program. Although test time monitor 409 is illustrated as residing in tester 408, in other embodiments, test time monitor 409 may reside in station controller 407 or within a separate subordinate computer system in communication with station controller 407 and/or tester 408. In other embodiments, in addition to or instead of test time monitor 409, watchdog test timer 404 (discussed above) may be used for example to generate a termination signal when a predefined test-time limit has been exceeded.

In one embodiment, test status monitor 410 generates information as testing progresses about which of the tests within the test program is presently executing, for example logging the identity of presently executing tests. For example, test status monitor 410 may provide status of progress through the various tests of the test program for each device being tested, for use by test-time tail cut-off algorithm engine 405. In this example, status is updated test-by-test and stored in system memory, as testing progresses through the test program. In one embodiment, the status can be updated to any of the following inter-alia: busy (i.e. still testing), ready (finished testing), passed, and/or failed, whereas in another embodiment subsets of these statuses are monitored. For example, in one embodiment if a device fails an individual test in the test program, the failing result (status) may be logged and the test program terminated, whereas in another embodiment, the failing result (status) may be logged with testing continuing to the subsequent test in the test program.

In one embodiment, yield monitor 411 generates data on the number of too slow testing (i.e. aberrant) devices whose testing has been aborted (for example out of the collection of devices under test and/or on a factory production level). In another embodiment yield monitor 411 generates data on the total number of devices tested (for example out of the collection of devices under test and/or on a factory production level), additionally or alternatively. In another embodiment, yield monitor 411 generates data additionally or alternatively on the number of devices that have failed not due to a tail cut off algorithm (where depending on the embodiment the failure can be for any other reason or due to predetermined circumstances, the number of failures may be for example out of the collection of devices under test and/or on a factory production level). In another embodiment, yield monitor 411 generates data additionally or alternatively on the number of too slow testing devices whose testing has not been aborted (for example out of the collection of devices under test and/or on a factory production level). For example, in one embodiment yield monitor 411 may indicate the cumulative number of devices out of the present collection of devices under test that have either failed the testing applied by the test program and therefore did not complete the test program (L), or have had testing aborted due to test-time tail cut-off algorithm failure (M). In this example, both of these quantities are tracked, cumulatively incrementing from an initial value of '0' as testing progresses, along with the total cumulative number of devices tested from the collection of devices under test (N), also set to an initial value of '0'.

The collection of devices under test (N) being monitored in this manner may be derived from a single parallel test group (assuming parallel testing), a plurality of parallel test groups (assuming parallel testing), a single touchdown assuming parallel testing (which may or may not be a single parallel testing group—see below), a plurality of touchdowns (assuming parallel testing), a single wafer, a single manufacturing (fabrication, assembly or final test) lot (i.e., a group of wafers or a set of packaged parts with common manufacturing history), a set of manufacturing lots (for example a certain number of consecutive lots or all lots processed in a certain period of time), or any other group of devices.

If the test operation in question involves a set of devices at an intermediate state of manufacturing between wafer and finished packaged product formats (such as "strip test"), similar collections of monitored devices are likewise applicable. In other embodiments, yield monitor 411 tracks only a subset of variables L, M, and N. For example, in one of these embodiments, only the variable M is tracked (i.e. the cumulative number of devices under test that have had testing aborted due to a test time tail cutoff algorithm). In other embodiments, yield monitor 411 tracks some particular numerical condition involving a combination of any of the variables L, M, and N. For example, in one of these embodiments, the total number of passing devices is tracked, which is equal to N minus L minus M. In other embodiments of system 400 the generation and/or tracking of one or more yield monitor variables may take place within system elements outside tester 408, for example, within the station controller 407 or within a separate subordinate computer system in communication with station controller 407 and/or tester 408.

In one embodiment, tester 408 supports testing of multiple devices in parallel. In one of these embodiments one or more of the monitors described herein (for example test time monitor 409, test status monitor 410, yield monitor 411, and watchdog test timer 404) are independently and simultaneously maintained for every device under test by tester 408.

In one embodiment, tester 408 may generate an availability signal to indicate to station controller 407 that (new) monitor data is available.

Handling equipment 413 includes in one embodiment a prober for handling a wafer and/or handler for handling an individual unit. A similar test cell can be used, for instance for the final stage test, wherein the handling equipment 413 includes a device handler adapted to handle packaged devices. In other embodiments, handling equipment 413 may also or instead include other equipment used to handle wafers or packaged integrated circuits.

In other embodiments, system 400 can include additional and/or other modules. For example in one of these other embodiments, system 400 is designed to support strip test including for example station controller 407, strip test handler 413. database 414 and tester 408.

In some parallel testing embodiments all devices in the same touchdown are tested in parallel (i.e. tester 408 supports the same number of units as prober/handler 413 supports). However, as described in U.S. application Ser. No. 11/175, 026, in some parallel testing environments, tester 408 may support less devices being tested in parallel than prober or handler 413 supports as being in the same touchdown. In one of these embodiments, system 400 also includes a multiplexing circuit interposed between tester 408 and prober/handler 413. The multiplexing circuit flexibly routes tester test-site signals to the individual devices contacted within the parallel test group, thereby supporting redeployment of tester resources to untested devices individually, and not necessarily as a group. In this arrangement, the tester resources (i.e. test-site) being used to test an aberrant device can be immediately redeployed to a fresh, untested device within the present touchdown when testing is interrupted on a slow-to-test device, without the need to mechanically reposition the set of contacts to connect tester-resources to an entire group of devices in a new touchdown. Test efficiency may therefore in some cases be increased (i.e. more devices can be tested in a given period of time and/or a given number of devices can be tested in a shorter period of time) compared to a testing environment where the number of units in the touchdown is limited to the number of units which can be tested in parallel (which may sometimes be lower). Unless stated otherwise, it should be assumed that any reference in the description herein to parallel testing is applicable to any type of parallel testing (i.e. synchronous, asynchronous, reallocation of testing resources within the same touchdown, no reallocation of testing resources within the same touchdown, etc.), as appropriate for the particular context.

In one embodiment of operation of system 400 for IC testing, tester 408 provides any of the following monitor data inter-alia to algorithm engine 405 (for example via database 414): logs/data indicating test execution status, logs/data of test-time of individual tests and/or test program, logs/data of device pass/fail results, logs/data of number of tested devices, logs/data of aberrant devices whose testing has been aborted and/or not aborted, and/or ready/busy data indicating device testing (in) completion status (i.e. the device is finished (ready) or testing (busy)). This data may be generated in real time by any of the monitors described herein (for example test time monitor 409, test status monitor 410, yield monitor 411, watchdog test timer 404. Depending on the embodiment, algorithm engine 405 may evaluate the data as the data is generated, the evaluation may be triggered for example by one or more events, by watchdog test timer 404, or by a tester-generated "availability" signaling to test station controller 407 of the availability of the monitor data during testing. The evaluation of the monitor data in connection with the desired algorithm may be based for example on product settings 401, test program settings 402 and/or rules and threshold settings 403. Depending on the result of the evaluation of the monitor data in connection with the desired algorithm, the test abort signal 406 may be asserted if necessary to abort the testing of a device-under-test which corresponds to the evaluated monitor data. In a multi-site parallel test environment, the functionality of the system described above is provided such that in one embodiment the test-time tail cut-off algorithm engine can check monitor data, and assert test termination functions independently—for each device within the parallel group of devices being tested, aborting testing of any devices failing the algorithm, for example in "real time" as the algorithm is executed.

In some embodiments, system 400 includes a computer program enabling algorithm execution, system I/O and control functions and storage. For example in one embodiment the computer program can include inter-alia: computer code/data to perform any of the following tasks: a) synchronize test-time tail cut-off algorithm execution with test program execution, to allow algorithms to identify aberrant devices in real-time, as testing progresses; b) access and retrieve from memory, for example from database 414, the (monitor) data generated by the monitors in tester 408 in real-time, for example as testing progresses (i.e. as data generated), in response to watchdog test timer 404 triggering, and/or in response to "availability" signaling; c) execute prescribed algorithms using the extracted monitor data to identify aberrant devices-under-test meeting conditions for forced test termination; and d) initiate the assertion of test-termination control signals such as abort signal 406 to abort testing when aberrant devices are encountered and termination conditions are satisfied. In a multi-site parallel test environment, the computer program is capable of applying the functions described above independently and simultaneously for each device within the parallel group of devices being tested.

In any environment, whether sequential or parallel, the test efficiency may in some cases be improved if the testing of too slow-testing (aberrant) devices is terminated rather than completed. By forcing test termination on identified aberrant devices always or under certain conditions, tester resources may optionally be redeployed from aberrant devices to any untested devices thereby increasing the number of devices tested in a given period of time, and/or testing may in some cases be completed more quickly for the given number of devices undergoing the test operation. In embodiments where there may be variation in test times among devices, forced test termination of aberrant devices may in some cases be an appropriate response.

In some embodiments individual devices which are identified as aberrantly slow-testing may have their testing aborted before testing is complete. These devices that are incompletely tested are marked as failures ("bad"), and therefore cannot be shipped "as is" as passing ("good") parts. In some of these embodiments, the devices whose testing was aborted are discarded. The yield loss associated with discarding devices whose testing was aborted is mitigated partly by the fact that such abnormal devices will frequently end up failing the test program, in any case. In others of these embodiments, the devices whose testing was aborted are not necessarily discarded. For example in one of these other embodiments, devices could be segregated for example during packaging (if they fail sort test) or could be segregated for example during final test, and then could be submitted for a batch reclaim operation later. Continuing with this example, in one of these embodiments a group of devices whose testing had been aborted (based on a tail cut off algorithm) that had the potential of yielding one or more passing devices had testing been allowed to be completed, might be processed as a single (long test-time) batch if and/or when test manufacturing capacity becomes available for processing such a batch.

In one embodiment, the criteria for allowing a device with abnormally long test time to continue testing (or to have testing interrupted) can be based at least partly on yield impact (i.e. on yield criteria), for example controlled as an additional "if statement" in a tail cut-off algorithm. The point at which an algorithm may override the elimination of test-time tails in favor of maximizing yield (i.e. maximizing the number of passing devices) may vary between products, test operations, embodiments, etc. That point may also be dynamic for a given product and test operation, being a customized function for example of various changeable factory test conditions such as the amount of available factory test capacity, the quantity of committed factory shipments, and the relative cost of test-time versus the value of a device whose testing has been aborted. In one embodiment, depending at least partly on the value(s) of yield related parameters, identification of aberrant devices may be performed or suspended.

Some methods of the invention executed for example by system 400 rely on comparing monitor data to the value(s) (i.e. settings) of one or more time-related parameters and optionally to the value(s) (i.e. settings) of one or more yield-related parameters, in order to identify aberrant devices that are abnormally slow to test. For example in certain embodiments, the monitor data may include measurements of "total" test time for a device (i.e. time to complete the test program for a particular test operation on that device) and/or measurements of "per test" test time for a device (i.e. time to complete a test in the test program on that device). For example, in certain embodiments the time-related parameter(s) and/or yield parameter(s) may be statistically or theoretically determined.

For example in certain algorithms of the invention time related parameters may comprise any of the following inter-alia: maximum total test-time permitted for a device, and/or maximum (per test) test-time permitted for individual test(s) within the aggregate test program for the device, based for example on the longest test-time(s) expected within the population of normal devices, so as to be able to distinguish aberrant devices which are testing too slowly compared to the normal device population.

In some embodiments of the invention there is flexibility in how the values for time related parameter(s) and/or yield related parameter(s) are set, thereby allowing flexibility in defining under which conditions a device is identified as aberrant and/or permitting application of overriding yield-based criteria to limit the yield loss if an unacceptably large number of aberrant devices are identified. Each time related parameter(s) and/or yield related parameter can be set to a fixed value dependent on a baseline sample or can be adapted (i.e. be customized) over time, for example varying with the characteristics of material being tested. For example an adaptive parameter can be statistically updated as testing progresses, as will be described in more detail below. A particular time related parameter and/or yield related parameter may not necessarily be uniform for all devices undergoing testing (i.e. may in some cases be customized), as will be described in more detail below.

Before proceeding with describing some of the possible algorithms of the invention which may be executed for example by system 400, definitions and symbols for some parameters are provided here. Each of the algorithms described below may include all or a subset of the following parameters, optionally in addition to other parameter(s). Other embodiments may additionally or alternatively use other parameter(s).

1. Typical Test-Time for Test #n ($ttyp_n$)

The $ttyp_n$ parameter quantifies in some algorithms the typical test-time required for execution of any one of the tests (i.e., test #n) in the test program. As applied in some test-time tail cut-off algorithms, the $ttyp_n$ parameter is defined as the time in which a given percentage of normal devices executing test #n are able to complete testing (where the given percentage may vary depending on the embodiment). The setting (i.e. value) of the $ttyp_n$ parameter may be determined for example from the statistical distribution of the test-times of a sample of previously tested devices (where the sample may be from a single point in time or from a time period of any length depending on the embodiment), or for example the value may be set based on theoretical considerations. Whichever approach is used, the value of $ttyp_n$ may be fixed or variable (being adjusted automatically, semi-automatically or manually). For example the value of $ttyp_n$ may in some cases depend on the fabrication conditions of the material tested, and therefore in some of these cases a $ttyp_n$ value associated with a test in a test program may vary as fabrication processing varies. In one embodiment there may be a plurality of $ttyp_n$ values associated with the same test in the same test program, and monitor data from different groups of devices are compared to different $ttyp_n$ values. In one embodiment, test program settings module 402 includes $ttyp_n$ value(s) related to each test included in each test program.

Figure 5:
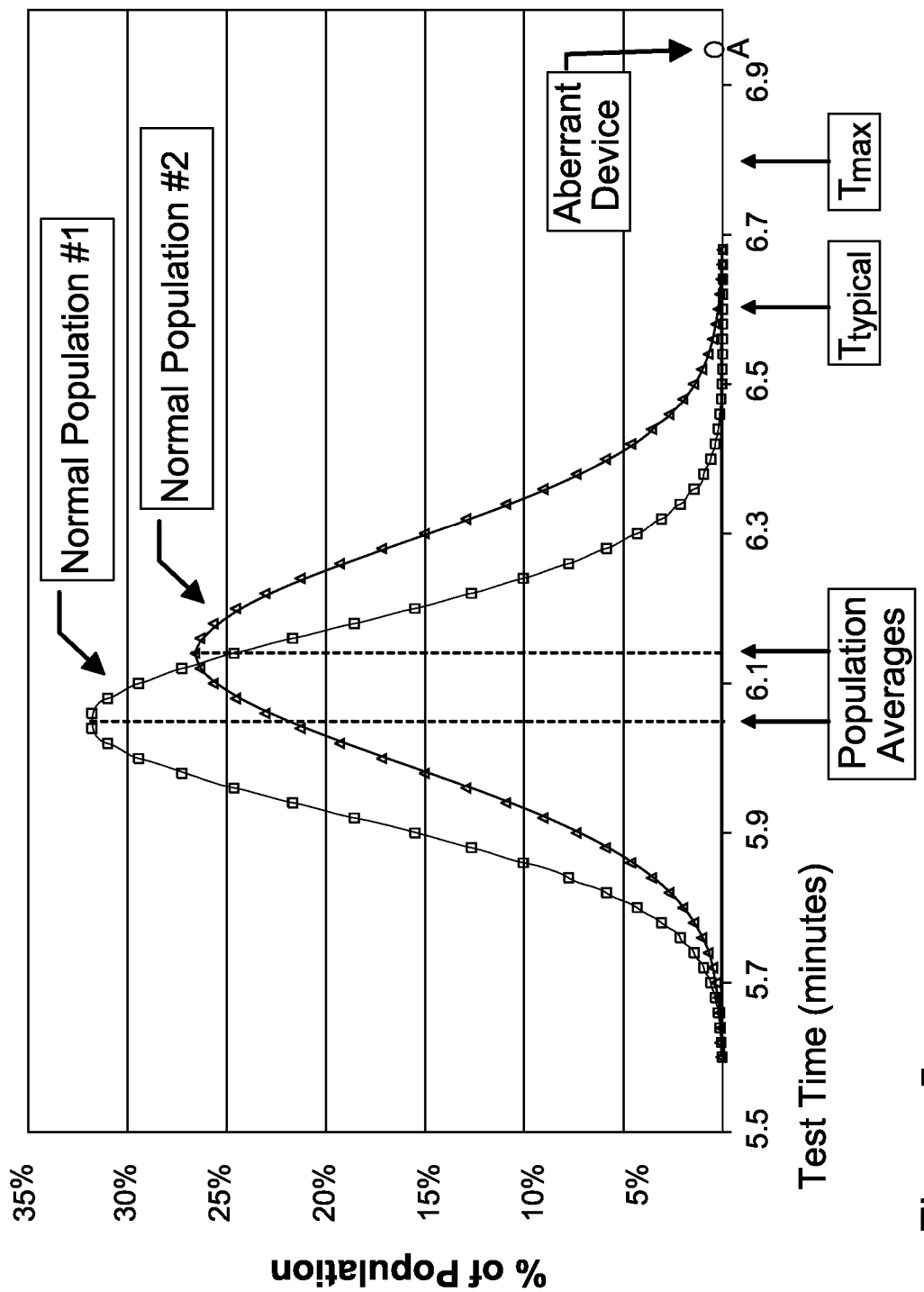
FIG. 5 is an illustration of a test-time distribution model, based on Gaussian statistics, according to an embodiment of the present invention.

A value for $ttyp_n$ may be determined for example by statistical analysis of measured test time values for test #n, based on actual test time measurements from a population of devices statistically representative of the devices to whose testing embodiments of the invention will be applied. Refer to FIG. 5 which illustrates a Gaussian distribution used for modeling the measured test times of a statistically representative population, according to an embodiment of the present invention. Herein below the Gaussian parametric distribution is used when discussing parameter definition because this distribution is well known and simple to understand however it should be understood that any parametric distribution (for example Poisson etc.) and/or any other statistical analysis may be used additionally or alternatively when defining one or more algorithm parameters. Referring to FIG. 5, the distribution test time average and standard deviation may be derived, and the $ttyp_n$ parameter based on the distribution may be set to a value of the average plus X standard deviations. X for example may be a number large enough to represent the upper end of the distribution (normal devices with slower-than-average test time), for example in some cases X=3 or X=4, but not so large to allow an aberrant device to be falsely accepted as normal. For example, for normal population #2 in FIG. 5, $ttyp_n$ is labeled $T_{typical}$.

Alternatively, a $ttyp_n$ value may be theoretically determined, based for example on detailed analysis of the expected execution time of device internal operations (internal BIST algorithm clock cycles, and the like) and/or the bus cycles required between the tester (such as tester 408) and the device for execution of test #n in the test program. By applying such an analysis to a normal device, combined with device performance data derived from circuit simulation of the elemental device operations contained within test #n, an upper bound may be placed on the expected test execution time of normal devices, which may be then used as the $ttyp_n$ value.

As an illustration of a theoretically determined $ttyp_n$ value, consider the non-limiting example of a flash memory device that includes in the test program thereof a test to program a set of data into the flash memory array. The value of $ttyp_n$ is the typical test-time required for execution of this test, or specifically in this case, the typical time required for programming the desired data into the flash memory device. This programming operation may involve asserting a sequence of memory addresses and data to be written onto the device inputs from the tester, while for each address/data combination initiating a BIST algorithm utilizing a microcontroller and circuitry internal to the device to select a group of flash memory cells to be programmed. Flash programming pulses would then be repeatedly applied to the group, up to some maximum number of pulses allowed, until the selected cells are either fully programmed, or until the selected cells exceed the maximum pulse allowance and fail. For each address associated with the cells requiring programming within the flash memory this internal algorithm will be executed. Cell selection and programming occurs address-by-address, until the desired set of data has been fully written to the device. Based on an assumed complete knowledge of the timing of the above operations and the details of the algorithms involved, a typical time and a maximum time required to complete such a programming test can be computed. For example, if the flash memory device contains a total of $2^{20}$ addresses (1,048,576) requiring programming, each requiring a minimum of 1 programming pulse and no more than 10 programming pulses to write the desired data to the flash cells of that address, with programming execution time of 0.5 microseconds per pulse, then the total time for this test theoretically required ranges from:

Minimum Time=1,048,576 addresses*1 pulse/address*0.5 microsec/pulse=0.524 seconds Maximum Time=1,048,576 addresses*10 pulse/address*0.5 microsec/pulse=5.24 seconds Therefore, under the above described conditions, the most time that will be needed for a normal device to complete this test is 5.24 seconds, and no device will complete the sub-test in less than 0.524 seconds. The range in this case depends on the number of programming pulses that each address programmed requires, which is a function of fabrication process conditions and may vary between devices, or even between flash cells within devices.

Based on the above theoretical analysis, a $ttyp_n$ value of 5.24 seconds may in some cases be acceptable, guaranteeing that all devices programming in this time or less are accepted as normal. However, this value may in some cases be a conservative value since the value is based on the assumption that the flash cells within every address accessed require the maximum number of pulses to program, an unlikely event. The estimate may in some cases be improved with some knowledge of the actual number of pulses that a typical flash cell requires. For example, if it is known through device characterization that the vast majority of flash cells will successfully program in 3 pulses, then a $ttyp_n$ value of 1.572 seconds (1,048,576 addresses*3 pulse/address*0.5 micro-second/pulse) may in some cases be a better choice than the value of 5.24 seconds which was derived under the worst-case scenario of 10 programming pulses per address.

Alternatively, if a statistically-based (i.e. empirical) approach were instead applied in this example, an appropriate collection of actual test-time data for this test could be used to determine the $ttyp_n$ value. For example, if the actual data fit a Gaussian distribution well, the data may be used to calculate an average and standard deviation, defining a $ttyp_n$ value, for example, as equal to the average plus four standard deviations. If it is found that, on average, 1.048 seconds are required to successfully write data to the flash array (an average of 2 programming pulses per address), then 50% of normal devices will test faster and 50% will test slower than this value. Further, if it is found that the calculated standard deviation is 0.200 seconds, then a $ttyp_n$ value defined as the average plus four standard deviations would be 1.884 seconds (1.048 seconds+4*0.200 seconds). According to standard Gaussian statistics, the probability of encountering a normal device with test time greater than this value would be only 0.003%. Putting it another way, for this distribution and statistical model, 99.997% of normal devices would exhibit flash programming sub-test times of less than 1.884 seconds.

The targeting of physical parameters within a fabrication process may drift through time, and the spread of the distribution of any given physical parameter may also vary with time. Therefore, the sample selection used to form a representative population for any of the above illustrative statistical computations may in one embodiment include material processed over a time period long enough to model the full range of historical fabrication conditions observed. In another embodiment, the sample may instead or also be based on material specifically selected from the extremes of the fabrication process conditions expected, derived either from the naturally occurring variation found in manufacturing or from material deliberately fabricated to the extremes of process conditions for evaluation purposes.

Referring again to FIG. 5, there are two sets of normal test-time populations modeled as Gaussian distributions. To avoid invalid identification of a normal device as abnormal, in some embodiments the $ttyp_n$ value (defined, for example, as a value equal to the population average plus 4 standard deviations) would be derived from the population with the higher typical test time, (in this example normal population #2 with typical test time labeled $T_{typical}$ in the graph) rather than from normal population #1 in order to reduce the likelihood that any devices in population #1 and population #2 are mistakenly classified as aberrant.

FIG. 5 may also or alternatively illustrate the possibility of a $ttyp_n$ value for a specific test in a specific test program varying over time (i.e. allowing the value to be customized). Assuming that normal population #2 is a sample from a later period of time than normal population #1, it is possible that the $ttyp_n$ value was changed from a value based on normal population #1 to $T_{typical}$ (which as described above is based on normal population #2). The opposite is also possible, i.e. that normal population #1 is a sample from a later period of time and that the $ttyp_n$ value changes from $T_{typical}$ to a value based on normal population #1.

In one embodiment, from within any given mother population, sub-samples may be extracted, each corresponding to a subset of devices which can be assumed to respond similarly to testing, for example because of relevant common fabrication attributes. Examples of subsets which depending on the embodiment may be assumed to respond similarly to testing include inter-alia: devices from similar regions of the wafer, devices from the same lithography exposure, devices from similar positions in a lithography exposure, devices from similar locations within a touchdown, or devices with similar fabrication process parameters. In one embodiment, any presumed source of systematic test-time variation may be factored into the calculation of customized $ttyp_n$ value(s) for a specific test in a specific test program to be applied during testing (of the specific test in the specific test program) to individual devices on a wafer that are influenced by those factors.

In one embodiment, a statistical model may be based on a sample which assumes no systematic variation in response to testing between devices in a wafer and hence a uniform $ttyp_n$ value for a specific test in a specific test program may be computed against which monitor data from any device undergoing that test is compared. In another embodiment, a separate statistical model may be based on each sub-sample compiled for a subset of devices which are assumed to respond similarly to testing and therefore a customized $ttyp_n$ value (for a specific test in a specific test program) may be separately computed for each sub-sample. In this other embodiment, each $ttyp_n$ value is specifically applicable to like devices and therefore monitor data from like devices is compared against that specific $ttyp_n$ value when performing that test.

As mentioned above, a possible criterion for grouping devices sharing an assumed common response to testing may be based on the positioning of devices in a wafer. For example, the geographical criteria which may be based on wafer rings. During semiconductor fabrication, it is possible that wafers are treated in one or more chemical processes. For example some of the chemical processes may involve gases while others may involve liquids. Continuing with the example, during different fabrication operations, the liquids/gases may be applied to the wafer in an appropriate form, for example from above the wafer (e.g. liquid) or from the sides (e.g. gas). In many cases, different areas on the wafer will receive different amounts of gases/liquids. As another example, during fabrication, electrons may be thrown at the wafers. Different areas of a wafer may receive different doses of the electrons. Because of the round characteristic of the wafer, each differentiated area of the wafer (differentiated from other areas for example in doses of gases, liquids, and/or electrons) may in some cases be observed on the wafer as a circular ring, where the devices in a given circular ring are assumed to react similarly to testing. Continuing with the example, assuming a fabrication process that naturally produces devices towards the center of wafers with test-times that are systematically faster than the test-times of devices at the wafer edge, the computations described above for deriving appropriate $ttyp_n$ values may be done for each of the two regions independently. The resulting $ttyp_n$ values may be applied during testing as appropriate for devices contained in each region, with devices towards the center evaluated against one $ttyp_n$ value and devices towards the edge evaluated against another $ttyp_n$ value.

As another example of positioning, neighbors in proximity to one another geographically on a wafer may be assumed to respond similarly to testing. This assumption of similar response may be based on the assumption that because neighbors in proximity were fabricated similarly, the neighbors in proximity should also behave similarly and respond similarly under testing. The degree of proximity may be any suitable proximity, for example one device, two device, radius (distance from a device), etc.

As another example of a possible criterion for grouping devices sharing an assumed common response to testing (i.e. assumed to respond similarly to testing), consider a plurality of lithography exposures in one wafer. As is known in the art, lithography is the process of imprinting patterns on semiconductor materials to be used as integrated circuits. During the lithography process masks are used to expose at least one device at a time, where the exposure is replicated again and again across the surface of a silicon wafer. The mask is usually product specific. If the mask includes more than one device, then more than one device is included in the same exposure.

Figure 6:
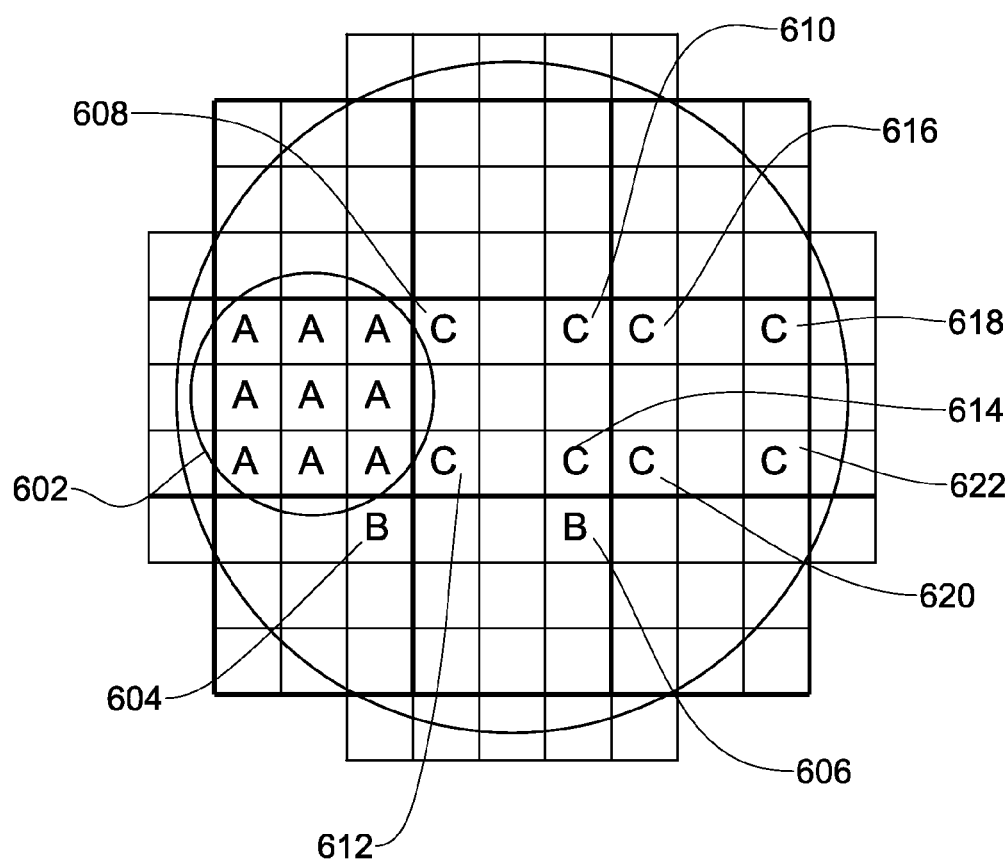
FIG. 6 is an illustration of wafer exposures, according to an embodiment of the present invention.

Refer to FIG. 6, which illustrates lithography exposures, according to embodiments of the present invention. In FIG. 6, each lithography exposure (in the illustration including nine devices each) is shown bounded with thicker lines. In one embodiment, the devices in a single lithography exposure may be assumed to respond similarly to testing due to the common exposure, for example devices 602 marked A. Therefore devices 602 would be evaluated against a $ttyp_n$ value computed from a sub-sample of devices derived from the same exposure location from other similar wafers.

In other embodiments, the devices in the same relative position within each of a plurality of exposures may be assumed to respond similarly to testing, for example due to the mask design used in the fabrication process. For example in one of these embodiments illustrated in FIG. 6 device B 604 and device B 606 which are in the same relative position within two successive exposures may be assumed to respond similarly to testing and would be evaluated against a $ttyp_n$ value computed from a sub-sample of devices from the same relative position, whereas devices C 608, 610, 612, 614, 616, 618, 620, and 622 may be assumed to respond similarly to testing and would be evaluated against another $ttyp_n$ value computed from a sub-sample of devices from the same positions. Note that in FIG. 6, devices C are also distinguished by being devices that are in the outer portion of each exposure.

2. Typical Total Test-Time (Ttyp)

The Ttyp parameter quantifies in some algorithms the typical test-time required for execution of the entire set of tests in the test program. As applied in some test-time tail cut-off algorithms, the Ttyp parameter is defined as the time in which a given percentage of normal devices are able to complete testing (where the given percentage may vary depending on the embodiment). The setting (i.e. value) of this Ttyp parameter may be determined for example from the statistical distribution of the test-time of a sample of previously tested devices (where the sample may be from a single point in time or from a time period of any length depending on the embodiment), or for example the value may be set based on theoretical considerations. Whichever approach is used, the value of Ttyp may be fixed or variable (being adjusted automatically, semi-automatically or manually). For example, the value of Ttyp may in some cases depend on the fabrication conditions of the material tested, and therefore in some of these cases the Ttyp value associated with the test program may vary as fabrication processing varies. Similar approaches to evaluating the value of the parameter as described above with reference to FIG. 5 may be used with respect to Ttyp, mutatis mutandis. In one embodiment there may be a plurality of Ttyp values associated with the same test program, and monitor data from different groups of devices (with each group sharing an assumed common response to testing) are compared to different Ttyp values. Similar approaches to grouping together devices sharing an assumed common response to testing and deriving time values relating to each group separately as described above with reference to the $ttyp_n$ parameter, may be used with respect to Ttyp, mutatis mutandis.

A value for Ttyp may be determined for example by similar statistical or theoretical analysis methods as described above for test values, $ttyp_n$, mutatis mutandis. Since Ttyp represents the typical test time for execution of the full suite of tests in the test program, the data used for the statistical analysis in one embodiment may be that of the actual full test program execution time (measured time to execute the entire set of tests in the test program), whereas in another embodiment the data used in a statistical analysis may be based on appropriate statistical addition of the data derived from the set of individual test values, making up the full suite of tests in the test program. In another embodiment the value of Ttyp may be based on theoretical estimates of the typical full test program execution time. In one embodiment, test program settings module 402 includes Ttyp value(s) related to each test program. Refer to the above discussion of the $ttyp_n$ parameter for additional details which can be applied to the evaluation of the Ttyp parameter, mutatis mutandis.

3. Maximum Test-Time Limit for Test #n ($tmax_n$)

The $tmax_n$ parameter quantifies in some algorithms the maximum test-time limit, defined for each of the tests (i.e., test #n) in the test program. As applied in some test-time tail cut-off algorithms, devices whose test-time for test #n exceeds the $tmax_n$ limit value are defined as aberrant. The $tmax_n$ limit setting (i.e. value) may be derived for example from the statistical distribution of the test-time of a sample of previously tested devices (where the sample may be from a single point in time or from a time period of any length depending on the embodiment), or for example the limit value may be set based on theoretical considerations. Whichever approach is used, the tmax$_n$ limit value may be fixed or variable (being adjusted automatically, semi-automatically or manually). For example, the value of tmax$_n$ may in some cases depend on the fabrication conditions of the material tested, and therefore in some of these cases the Tmax value associated with the test program may vary as fabrication processing varies. As another example, in one embodiment the setting of the tmax$_n$ value may depend on test factory conditions, for example on the available manufacturing test capacity, defined-above as the volume of material that can be processed through a factory test operation within a fixed period of time given the test equipment available and test-times involved. Continuing with the example, given too little test equipment and/or excessively long device test-times, the test factory may be unable to meet product test output commitments, motivating a reduction in the values selected for tmax$_n$. Still continuing with the example, reduced tmax$_n$ values may in one embodiment cause more devices to be identified as aberrant, thereby minimizing the impact of test time tails on test capacity. As another example, if test capacity is not constrained because there is a lot of test equipment and device test times are short, then if maximizing the number of passing devices is a priority (i.e. maximizing yield is a priority), tmax$_n$ values may be set high to allow all devices except those with the worst test time tails to complete the test program. In one embodiment, the tmax$_n$ values may be dynamic, being manually, semi-automatically or automatically revised according to prevailing test factory conditions.

Like the ttyp$_n$ calculations described above, a value for tmax$_n$ may in some cases be determined by statistical analysis of measured test time values for test #n, based on actual test time measurements from a population of devices statistically representative of the devices to whose testing the invention will be applied. As a non-limiting example, the distribution may be modeled as Gaussian from which a distribution test time average and standard deviation may be derived, and tmax$_n$ may be set to a value of the average plus Y standard deviations. Continuing with the example, Y may be a number small enough to discern aberrant devices, for example in some cases Y=5 or Y=6, but not so small that an unacceptable number of devices from the Gaussian distribution are falsely rejected as aberrant. As mentioned above, any parametric distribution (including Poisson etc) and/or any other statistical analysis may be used additionally or alternatively when defining tmax$_n$. For example, in one embodiment the tmax$_n$ value limit may be derived using non-parametric statistical methods on the test-time data, such as sorting a representative set of normal test-time data and selecting the maximum value as the tmax$_n$ value.

The same sample selection considerations described above in the discussion of the ttyp$_n$ calculations (for example including full range of historical conditions, for example including extremes of the expected fabrication process conditions, for example varying over time) apply equally in tmax$_n$ calculations, mutatis mutandis. This point is illustrated in FIG. 5, where tmax$_n$ (labeled T$_{max}$ in the figure) is derived based on population #2. A value for the maximum allowed test-time, labeled T$_{max}$, is shown in FIG. 5 as situated above the T$_{typical}$ value, but below the value "A" illustrating the test-time of an aberrant device. As can be understood from FIG. 5, increasing the value of T$_{max}$ above the T$_{typical}$ value decreases the probability of a normal device being classified as abnormal, but also increases the probability that an abnormal device may go undetected. Correspondingly, decreasing the value of T$_{max}$ toward the T$_{typical}$ value increases the probability of a normal device being classified as abnormal, but also decreases the probability that an abnormal device may go undetected. In one embodiment the value of T$_{max}$ and the value of T$_{typical}$ may be coincident, defining a single threshold below which device test-times are defined as normal, and above which device test-times are defined as abnormal.

In some embodiments, the determination of the tmax$_n$ values, may be based on addition of a test-time guardband to the longest expected test-time value of a normal device, whether established statistically (empirically) or theoretically. The size of this guardband may in one of these embodiments be set based on economic considerations, balancing the risk of undesired yield loss due to test-time tail cut-off if the guardband is too small and the risk of allowing unidentified aberrant devices to increase overall test time if the guardband is too large. For example using a test time distribution modeled on a Gaussian, a value for tmax$_n$ may be chosen equal for example to the test-time average+5*standard deviations when reducing the excessive test interval is more important than maximizing yield, for example when the allowable test interval is extremely limited and the quantity required for factory device shipment commitments is not in jeopardy. Continuing with the example, on the other hand, a higher value for tmax$_n$ may be chosen, for example equal to the test-time average+6*standard deviations when maximizing yield is more important than controlling excessive test time, for example when the quantity required for factory device shipment commitments is in jeopardy and it is considered reasonable to increase the test interval.

In one embodiment there may be a plurality of tmax$_n$ values associated with the same test in the same test program, and monitor data from different groups of devices (with each group sharing an assumed common response to testing) are compared to different tmax$_n$, values. Similar approaches to grouping together devices sharing an assumed common response to testing and deriving time values relating to each group separately as described above with reference to the ttyp$_n$ parameter, may be used with respect to tmax$_n$, mutatis mutandis. Refer to the above discussion of the ttyp$_n$ parameter for additional details which can be applied to the evaluation of the tmax$_n$ parameter, mutatis mutandis.

In one embodiment, the rules and threshold settings module 403 includes tmax$_n$ value(s) related to each test included in each test program.

4. Maximum Total-Test Time Limit (Tmax)

The Tmax parameter quantifies in some algorithms the maximum total test-time limit, defined for the entire set of tests in the test program. Devices whose total test-time exceeds the Tmax limit are defined as aberrant. The Tmax limit setting (i.e. value) may be derived from the statistical distribution of the test-time of a sample of previously tested devices (where the sample may be from a single point in time or from a time period of any length depending on the embodiment), or for example the value may be set based on theoretical considerations and/or on manufacturing test factory conditions such as capacity. Whichever approach is used, the Tmax limit value may be either fixed or variable (being adjusted automatically, semi-automatically or manually). For example, the value of Tmax may in some cases depend on the fabrication conditions of the material tested, and therefore in some of these cases the Tmax value associated with the test program may vary as fabrication processing varies. As another example, the Tmax value may vary as test factory conditions vary as described above for tmax$_n$, mutatis mutandis. Similar approaches to those described above with reference to FIG. 5 may be used when evaluating Tmax, mutatis mutandis. In one embodiment there may be a plurality of Tmax values associated with the same test program, and monitor data from different groups of devices (with each group sharing an assumed common response to testing) are compared to different Tmax values. Similar approaches to grouping together devices sharing an assumed common response to testing and deriving time values relating to each group separately as described above with reference to the ttyp$_n$ parameter, may be used with respect to Tmax, mutatis mutandis.

In one embodiment, Tmax may be determined by similar statistical or theoretical analysis methods as described above for the individual test limits, tmax$_n$, mutatis mutandis. Since Tmax represents the maximum test time allowed for execution of the full suite of tests in the test program, however, the data used for the statistical analysis in one embodiment may be that of the actual full test program execution time (measured time to execute the entire set of tests in the test program), whereas in another embodiment the data used in a statistical analysis may be based on appropriate statistical addition of the data derived from the set of individual test values, making up the full suite of tests in the test program. In another embodiment the value of Tmax may be based on theoretical estimates of the maximum full test program execution time.

In one embodiment the Tmax value may be identical as the Ttyp value. In some embodiments, similarly to the method given for establishing the tmax$_n$ values, mutatis mutandis, the Tmax value may be based on addition of a test-time guardband to the longest expected total test-time value of a normal device, whether established empirically or theoretically, where in one of these embodiments the size of the guardband may be set based on economic considerations. Refer to the above discussion of the ttyp$_n$, Ttyp and/or tmax$_n$ parameter for additional details which can be applied to the evaluation of the Tmax parameter, mutatis mutandis.

In one embodiment, the rules and threshold settings module 403 includes Tmax value(s) related to each test program.

5. Maximum Tail Cut-Off Failures Allowed (Fail_Limit)

The Fail limit parameter quantifies in some algorithms the maximum number of devices during a test operation allowed to have testing aborted early to eliminate/reduce test-time tails. The Fail limit parameter is an example of a yield related parameter. (As explained above in some embodiments one or more yield related parameters may affect whether a device with abnormally long test time continues testing or has testing interrupted, and/or may affect whether identification of aberrant devices is performed or suspended.)

In one embodiment, a Fail Limit setting (i.e. value) is defined for a given test program and a given collection of devices. In one embodiment, the Fail Limit is defined as a whole number, representing the maximum number of devices allowed to have testing aborted out of a collection of devices tested (see above some examples of possible collections), whereas in another embodiment the Fail Limit may be expressed as a percentage or fraction of all devices tested in the collection. The Fail Limit value may be derived from the statistical distribution of the failure rates of a sample of previously tested devices (where the sample may be from a single point in time or from a time period of any length depending on the embodiment), or the value may be set for example based on theoretical considerations, test factory manufacturing capacity constraints, test factory shipment commitments, the relative cost of increased test duration versus the value of the device whose testing is interrupted, and/or on other test factory conditions. The Fail Limit value may be either fixed or variable (being adjusted/customized automatically, semi-automatically or manually). For example, in one embodiment, the Fail_Limit value may be dynamic, continuously changing during testing as the yields observed on the material being tested changes, whereas in another embodiment the Fail Limit value may be constant for a given product. As an example of dynamic variation, assuming the collection of devices is a fabrication lot, the Fail Limit value may be initially set to zero or a small amount when testing commences on the fabrication lot and if and when the yield (i.e. number of passing devices) for the fabrication lot exceeds a predetermined value the Fail Limit value may be raised. Depending on the embodiment, the Fail Limit value may or may not vary for different groups of devices which are assumed to respond differently to testing. For example, if it is known that devices with aberrant test times from a specific group of devices are more likely to produce a reliability problem if these devices pass testing than devices with aberrant test times from another group of devices, then in one embodiment the specific group of devices may have a more stringent Fail Limit than the other group.

For example, the Fail Limit value may be a whole number $M_{max}$, limiting the number of M devices with aberrant test-times in any collection of N tested devices that may be sacrificed in order to reduce manufacturing test duration (i.e. $M \leq M_{max} \leq N$). There is no minimum value for Fail Limit, although selection of a value of '0' for $M_{max}$ effectively disables the test-time tail cut-off algorithm, permitting zero aberrant devices from being terminated. If the Fail Limit value is set to a higher number there is an increased risk that a large number of devices will have testing aborted.

As a non-limiting example of how a value for Fail Limit may be determined, a hypothetical case of a single manufacturing lot of 25 wafers being tested may be considered, where each wafer contains 1000 testable devices, tested in 10 consecutively parallel groups (in this example identical to 10 consecutively contacted touchdowns), with 100 devices tested asynchronously in parallel within each touchdown. For purposes of this example, it is assumed that each touchdown contains a single aberrant device with test time 25% longer than a normal device. If the Tmax value is set to a value capable of detecting such aberrant devices, and if the Fail Limit is set to a value of 10 devices per wafer (or alternatively, 250 devices per manufacturing lot) to limit the maximum number of devices allowed to fail the exemplary test-time tail cut-off algorithm and in this example to be discarded, then each wafer will incur yield loss of 10 devices (i.e. one aberrant device per touchdown is discarded). In this example, if the economic value to the test factory of a 25% reduction in overall test-time is greater than the value of the 1% yield impact (1 lost device per touchdown, assuming that every aberrant device would have passed testing had it been allowed to complete the test program), then on balance, factory economics would favor the use of the given value for Fail Limit. As an alternative hypothetical case, applying again the same parameters used in the scenario described above, but with the additional constraint of test factory output commitments dictating a maximum acceptable yield loss of 0.5%, the Fail Limit value may be reduced from 10 devices per wafer to 5 devices per wafer (or alternatively, to 125 devices per manufacturing lot). In this case, although it is assumed that the same number of aberrant devices would be encountered (1 per touchdown, 10 per wafer), only half of those would be forced to abort testing early and in this example be discarded. Yield loss due to this exemplary test-time tail cut-off algorithm would therefore be reduced by 50% compared to the first hypothetical case given; however, only half of the test touchdowns would benefit from reduced test-time, resulting in only a 12.5% reduction in overall test-time. These examples illustrate the potential for trade-offs between the amount of test-time reduction and the number of devices whose testing is aborted in any test-time tail cut-off algorithm containing provisions for limiting yield loss.

In further illustration of considerations when setting the maximum limit value for the number of devices during a test operation allowed to have testing aborted early to eliminate/reduce test-time tail, i.e. the Fail Limit, the Fail Limit value may be set so as to financially balance the savings from reduced test costs provided by test-time tail elimination against the cost associated with the loss of otherwise viable devices (i.e., yield loss at the test step). The value of Fail Limit in this embodiment may be a function of any of the following, inter-alia: the unit cost of testing, the typical test-time (Ttyp), the cost and value of the devices being tested, the probability of an aberrant device passing if fully tested, the test-time savings from aborting testing of aberrant devices, and/or other factors As a highly generalized and non-limiting example, a possible function could balance the cost of the yield loss associated with a particular Fail Limit value against the manufacturing cost savings of the reduced test duration produced by eliminating devices with aberrant test times. An example of the function is given below expressed as the "Total Cost Savings", which is the manufacturing savings realized when a test-time tail cut-off system is implemented under a particular set of values for $ttyp_n$, Ttyp, Tmax, $tmax_n$, and Fail Limit. In the function presented here Total Cost Savings would need to be positive for such values of $ttyp_n$, Ttyp, Tmax, $tmax_n$, and Fail Limit to make economic sense:

Total Cost Savings=Economic Value of Test-Time Savings−Economic Value of Lost Yield>zero In other embodiments, one or more other yield related parameter may be used in algorithms in addition to or instead of the Fail Limit parameter. For example, in one of these other embodiments, there may be a minimum yield parameter (i.e. minimum required number of passing devices) per collection of N devices, a maximum fail parameter per collection of N devices, i.e. $(L+M)_{max}$, a minimum yield parameter on factory level production, and/or a maximum fail parameter on factory level production as will be described in more detail below.

In other embodiments, algorithms may also or instead use parameter(s) representing the typical test time and/or maximum test time for executing a consecutive or not necessarily consecutive plurality of tests (less than all tests in the test program). The typical and/or maximum test time for the set of tests (where the set includes less that all the tests in the test program) may be determined in a similar manner as described above for Ttyp and Tmax respectively (which correspond to all the tests in the test program), mutatis mutandis.

Depending on the embodiment, one or more of the algorithm parameters settings (for example, $tmax_n$, $ttyp_n$, Tmax, Ttyp, Fail Limit, other time-related parameter(s), and/or other yield related parameter(s)) may or may not vary in different versions of a test program for the same product. For example if a different version of a test program did not impact on test execution time, then in one embodiment one or more of the algorithm parameter settings may remain the same.

In some embodiments, test factory manufacturing capacity constraints, test factory shipment commitments, the relative cost of increased test duration versus the value of the device whose testing is interrupted, and/or other test factory conditions may impact on the settings for test time parameter(s) (for example maximum test time settings for $tmax_n$ or Tmax) in addition to or instead of impacting on yield parameter setting(s) (for example Fail Limit value), causing those test time parameters and/or yield parameter settings to be customized in accordance with test factory conditions.

For example, if test factory capacity is low, for example due to limited test equipment, it may be acceptable in certain cases to try to increase test capacity by increasing the frequency of too-slow devices having testing cut off. The frequency can potentially be increased by changing any one or more criteria, for example by lowering the number of maximum test time parameters and/or lowering the values of maximum test time parameters (for example $tmax_n$, Tmax and/or maximum time for a plurality of tests) so that more devices are potentially designated as aberrant. The frequency can be potentially increased in addition to or instead of, by adjusting other criteria, for example increasing the Fail Limit value so that more devices that are designated as aberrant are allowed to have testing aborted. As another example, if test factory capacity is readily available, for example test equipment is underutilized or idle, it may be acceptable in some cases to try to reduce test capacity in order to try to maximize yield (the number of passing devices) by reducing the frequency of too-slow devices having testing cut off. The frequency can potentially be reduced by changing any one or more criteria, for example by raising the number of maximum test time parameters and/or raising the values of maximum test time parameters (for example $tmax_n$, Tmax and/or maximum time for a plurality of tests) so that less devices are potentially designated as aberrant. The frequency can potentially be reduced instead or in addition by adjusting other criteria, for example decreasing the Fail Limit value so that fewer devices that are designated as aberrant are allowed to have testing aborted. It should be evident that the potential change in capacity and/or yield may not in some cases be realized, because monitored data may not be as anticipated, for example because the characteristics of the devices under test are not always predictable.

In one embodiment, a general form of a test-time tail cut-off algorithm based on the parameters described above would involve monitoring the test-time of each test in the flow of each device within a test operation, and/or monitoring progress (status) of each device through the test program as a function of time. Based on the defined test-time limits ($tmax_n$, Tmax and/or maximum test time for a plurality of tests), and/or possibly on expected typical test-times to complete testing ($ttyp_n$, Ttyp and/or typical test time for a plurality of tests), aberrant devices (having a "test-time tail") may have testing terminated early, in some cases qualified by yield-related criteria, for example with the qualification that the termination does not cause the limit for maximum number of aborted devices (Fail Limit) to be exceeded. The goal of any such algorithm would be to increase test efficiency (compared to an environment where there is no such algorithm), in some cases while controlling the number of otherwise viable devices that are taken as yield loss due to aborted testing.

Figure 7:
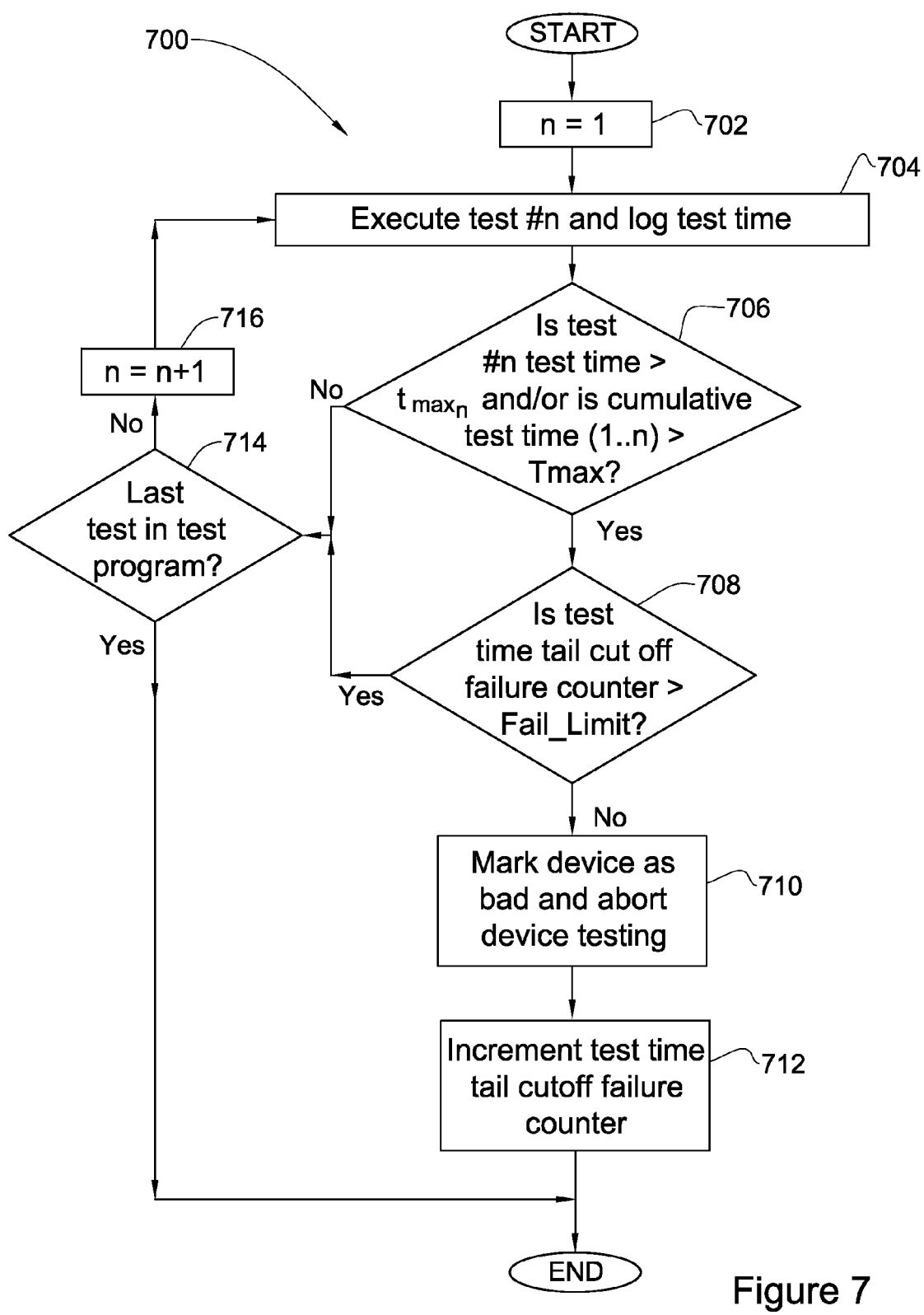
FIG. 7 is a flowchart of a method of aborting too-slow testing devices, according to an embodiment of the present invention.
Figure 8:
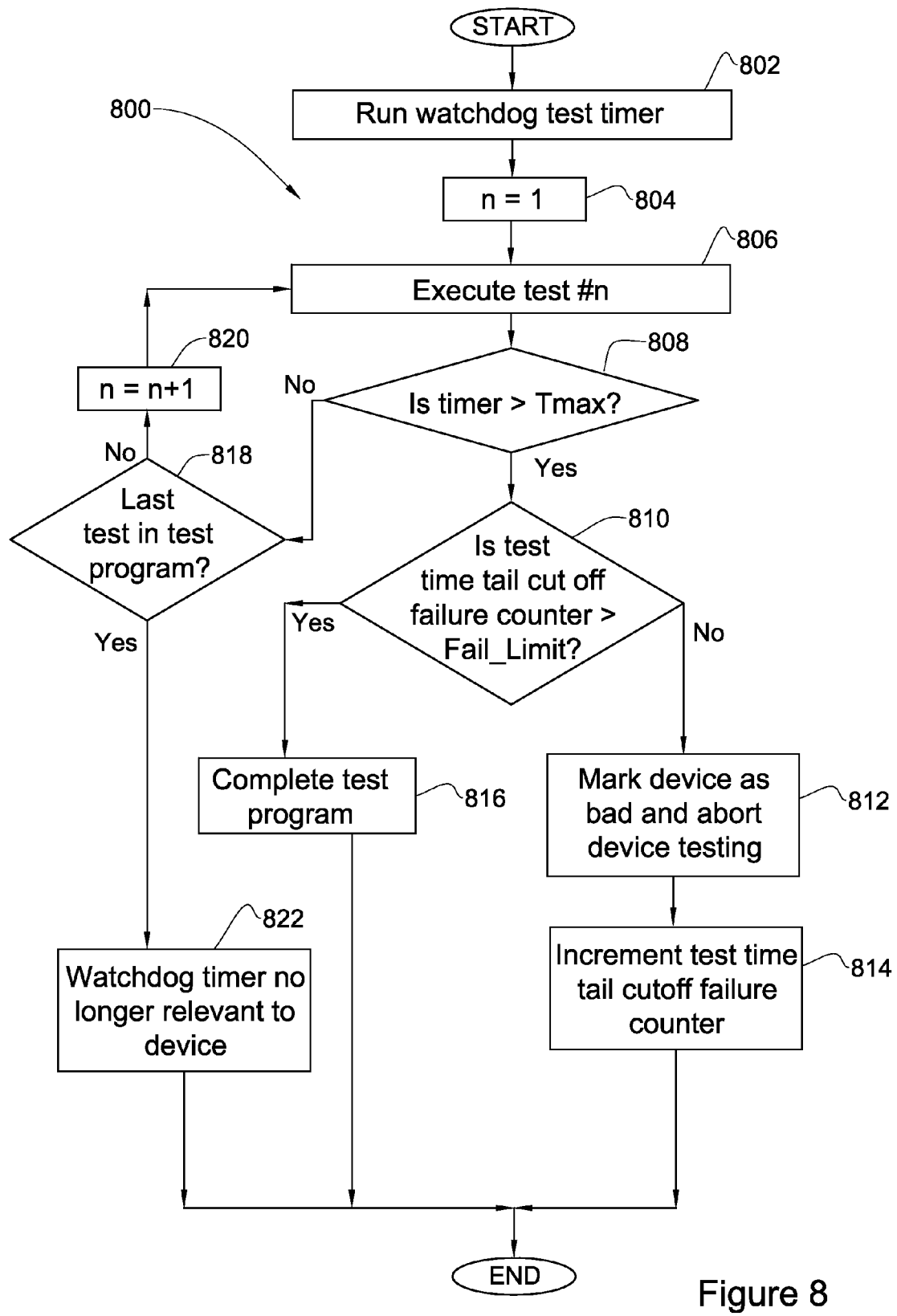
FIG. 8 is a flowchart of a method of aborting too-slow testing devices, according to another embodiment of the present invention.
Figure 9:
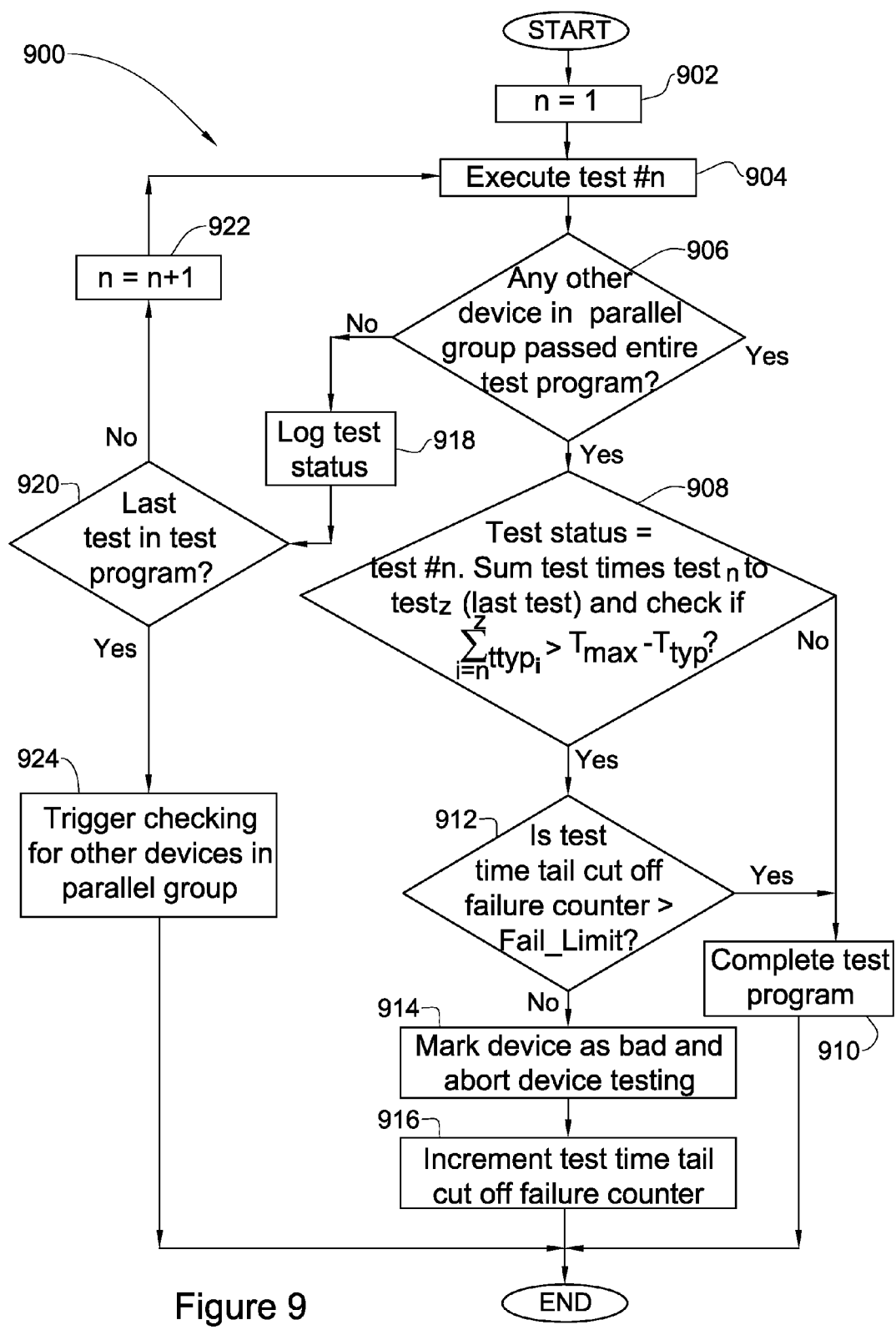
FIG. 9 is a flowchart of a method of aborting too-slow testing devices, according to another embodiment of the present invention.

Refer to FIGS. 7, 8, and 9 which illustrate in flowchart format methods 700, 800, and 900 respectively for semiconductor testing using various algorithms for test-time tail cut-off, according to various embodiments of the present invention. In other embodiments of the invention, fewer, more, or different stages than those shown in FIGS. 7 through 9 may be executed. In some embodiments, the stages may be executed in a different order than shown in FIGS. 7 through 9 and/or in some embodiments one or more stages may be executed simultaneously. Each of the stages of the method may be executed automatically (without user intervention), semi-automatically and/or manually.

Depending on the embodiment, more or less data may be monitored by tester 408. In the description of each algorithm and variants below, variables which are not directly required for determining whether any devices should be cut off are not explicitly mentioned although in some embodiments these variables may in some cases be monitored.

FIG. 7 illustrates method 700 for semiconductor testing with test time tail cut off, according to an embodiment of the present invention. In a sequential testing environment, method 700 may be applied as each device is tested sequentially whereas in a parallel testing environment, method 700 may be applied concurrently to each device tested in parallel.

Beginning with the first test as the current test (stage 702), each test in the test program is executed on the device, until testing is cutoff due to the test time algorithm or until the last test in the test program, (for example test program 412) is completed. In stage 704, the current test in the test program is executed by tester 408. Test time monitor data (for example from test time monitor 409) is logged. For example, the test time monitor data may include the test time for the individual test and/or the cumulative test time (i.e. for all tests in the test program that have already been executed). In one embodiment, the test time monitor data is stored in test database 414 from where it can be accessed by algorithm engine 405.

In stage 706, algorithm engine 405 compares the monitor data relating to test time to the value(s) (i.e. setting(s)) of one or more test time parameters. For example, in one embodiment the test time for the current test (i.e. test #n) may be compared to the maximum test time for that test, $tmax_n$, and the cumulative test time (i.e. for tests 1 through n) may be compared to the maximum test time for the test program Tmax. In another embodiment, only the test time for the current test (i.e. test #n) may be compared to the maximum test time for that test, $tmax_n$. In another embodiment, only the cumulative test time (i.e. for tests 1 through n) may be compared to the maximum test time for the test program Tmax. In another embodiment, the compared test monitor data and/or the compared test time parameter(s) may vary. In the illustrated embodiment where test time parameters represent test time limits, such as $tmax_n$ and/or Tmax, if one or more test time limits are exceeded then the device is considered a candidate for testing cut-off. The reader will understand that a testing environment where the values of both $tmax_n$ and Tmax need to be exceeded in order to consider a device as a candidate for tail cut off, has more stringent tail cut off criteria than an environment where only $tmax_n$ or Tmax need to be exceeded in order to consider a device as a candidate for tail cut off.

If the monitor data relating to test time does not exceed the one or more test time limits as defined for the embodiment, then as long as the last test in the test program has not been executed, method 700 iterates to the next test.

In some embodiments, if the monitor data relating to test time exceeded one or more test time limits (yes to 706), yield monitor data (for example from yield monitor 411) is compared by algorithm engine 405 to one or more yield parameters. For example, in the illustrated embodiment if the test time for the current test (i.e. test #n) exceeded the maximum test time for that test, $tmax_n$, and/or the cumulative test time exceeded the maximum test time for the test program Tmax then in stage 708, a yield comparison is performed. Based on the comparison, it may be decided whether or not to cut off testing for the device. For example, in the illustrated embodiment it is determined whether cutting off the testing of the current device (whose testing time(s) exceeded one or more test time limits) would cause the total number of devices cut off to exceed the maximum number of too slow testing devices allowed to have testing cut-off (i.e. Fail Limit). If cutting off testing on the device would cause the total number of devices cut off to exceed the value of the Fail Limit parameter, then testing proceeds for that device (stage 716), providing the current test is not the last test (stage 714). If on the other hand cutting off the device would not cause the Fail Limit parameter to be exceeded, a decision is made to abort testing on the device and to mark the device as bad (stage 710). For example test abort signal 406 may be asserted to interrupt testing. A counter (for example in yield monitor 411) which keeps track of the number of devices designated for test aborting is incremented (stage 712) to take into account the device designated for test aborting in stage 710.

In another embodiment, yield criteria are not taken into account. Any device which is a candidate for cut off as established in stage 706 is designated for test cut off in stage 710 with method 700 then ending for that device (i.e. stages 708 and 712 are omitted)

Assuming testing on the device has not been aborted and the last test in the test program has not been performed, method 700 iterates to the next test in stage 716.

At any point in the execution of the one or more tests in the test program in the illustrated embodiment, a device may exceed the specified test time limit(s) and be designated for termination, in some cases depending on yield constraints, as discussed above. Alternatively the device may complete the test program. If the device testing is sequential, then provided the tested device is not the last to be tested, then after the device has had testing aborted due to abnormally long test time or has completed the test program, the next device may be tested. If a plurality of devices are being tested in parallel, then in one embodiment the aborting of testing on a too-slow testing device does not impact on the testing of the other devices being tested in parallel (except in some cases indirectly by incrementing the tail cut off failure counter in 712) nor does the completion of testing on a device impact on the other devices being tested in parallel (unless the device is the last to be tested thereby signaling the completion of testing on the parallel group). In this embodiment, the testing continues independently for each other device, following method 700. For example, if the testing is in an asynchronous parallel environment, and regardless of whether a device exceeds the maximum test time for a given test and is therefore designated for test aborting, or alternatively completes the test program, remaining devices in the group are allowed to complete testing (provided these devices are within test time limits or the Fail Limit value has been exceeded) before connecting the multi-site parallel test hardware to a fresh set of untested devices. Alternatively, if tester resources can be redeployed in the asynchronous parallel environment, then upon aborting of testing on a device or after the device completes the test program, the tester resources (i.e. test-site) being used to test that device can be immediately redeployed to a fresh, untested device within the present touchdown.

In some embodiments, once yield conditions do not allow other devices to be cutoff, for example the number of devices whose testing has been cut off has reached the Fail Limit, method 700 may or may not be streamlined for all other devices tested under the same yield conditions, for example against the same Fail Limit. In one of these streamlined embodiments, for example, each test may be executed and the test time may be optionally logged (i.e. executing stages 702, 704, 714 and 716) with all other stages of method 700 omitted. This streamlined method may be appropriate in some cases if the yield conditions are static and remain as first established for a collection of devices under test, for example if the Fail Limit is constant for the collection of devices.

However in other embodiments, yield conditions may be re-established as testing progresses. Therefore in some of these other embodiments, method 700 continues to be performed on each device, with stage 708 (if reached) determining whether aborting testing on a candidate for test time tail cut off is feasible under the yield conditions as currently established (for example under the current Fail Limit.).

In one embodiment, there may be different values for any of parameters, $tmax_n$, Fail Limit, Tmax, other time related parameter(s), and/or other yield related parameter(s), for different groups of devices (for example in some cases there may be different value(s) for each group of devices assumed to respond similarly to testing). In this embodiment, monitor data relating to testing of a device is compared to the $tmax_n$, Fail Limit, Tmax, other time related parameter(s), and/or other yield related parameter(s) value appropriate to the group which includes that device.

In other embodiments, the comparison in stage 706 may additionally or alternatively involve a time limit parameter corresponding to a plurality of consecutive or not necessarily consecutive tests in the test program, for example a maximum time limit for executing. In some of these embodiments, monitored test time data for a plurality of tests in the test program are compared to the maximum test time setting for the plurality of tests, and if the monitored test time data exceeds the setting, stage 708 is executed. In one of these embodiments, there may be more than one grouping (plurality) of tests, and for each grouping the monitored data is compared to the maximum test time setting for that grouping. The time limit parameter value corresponding to each plurality of tests may or may not vary for different groups of devices, depending on the embodiment. For example in some cases there may be different value(s) for each group of devices assumed to respond similarly to testing.

In some embodiments, timing data may not be easily available in a test environment and/or timing data may only be available for a given test after the test is completed. In one of these embodiments, test status data (i.e. whether a given test and/or the test program has been completed) may be available, and method 800 and/or 900 may be applied.

FIG. 8 illustrates a method 800 for semiconductor testing with test time tail cut off, according to another embodiment of the present invention. In a sequential testing environment, method 800 may be applied as each device is tested sequentially whereas in a parallel testing environment, method 800 may be applied concurrently to each device tested in parallel. In the illustrated embodiment a "watchdog timer", for example watchdog timer 404, is set to a test-time limit, for example to the value of the Tmax parameter. In stage 802, the timer is initiated substantially at the same time that testing of the test program (for example test program 412) commences. In the case of sequential testing, the watchdog timer would be reset each time a new device is tested, and the Tmax value may be the same or not for each device. In one embodiment for parallel testing a single watchdog timer is set to a given Tmax value used for all the devices being tested in parallel, and is therefore reset each time a new parallel group begins testing. In another embodiment for parallel testing, the same algorithm may be applied to system 400 supporting multiple watchdog timers set to the same or differing Tmax values (and/or there may be a watchdog timer capable of being set to multiple values), with each watchdog timer applied to a different device or to a different subset of devices within the parallel group. For example in either sequential or parallel testing, different Tmax values may in some cases be applied to different subsets of devices, with devices in each subset assumed to respond similarly to testing.

Beginning with the first test (stage 804), each test is applied to the device in turn in stage 806 until the last test is applied or until testing is aborted because the device is too-slow testing. Assuming the watchdog timer does not trigger (i.e. set time, for example Tmax does not elapse) during the execution of the test or before moving to another test (no to stage 808), then the test is completed (i.e. proceed to stage 818) and the next test, if any is readied (stage 820) If on the other hand during execution of any test (i.e. prior to the completion of the test program), the watchdog timer reaches the test time limit (yes to stage 808), for example Tmax elapses, then the device is a candidate for having testing aborted. In some embodiments, if the device is still testing any of the tests in the test program when the watchdog timer reaches the test limit, yield monitor data (for example from yield monitor 411) is compared by algorithm engine 405 to one or more yield limits in stage 810. For example, in one of these embodiments it may be determined whether cutting off the testing of the current too slow-testing device would cause the total number of devices cut off to exceed the maximum number of too slow-testing devices allowed to be cut-off (i.e. Fail Limit). If cutting off testing on the device would cause the yield limit to be exceeded, then the incomplete test for that device, if any, is completed as well as any remaining tests in the test program (stage 816). If on the other hand cutting off the device would not cause the Fail Limit value to be exceeded, a decision is made to abort testing on the device and to mark the device as bad (stage 812). For example test abort signal 406 may be asserted to interrupt testing. A counter (for example in yield monitor 411) keeping track of the number of devices designated for test cut off is incremented (stage 814), to take into account the device designated for test aborting in stage 710.

In another embodiment, yield criteria are not taken into account and stage 812 directly follows a yes to stage 808 with method 800 then ending (i.e. stages 810, 814 and 816 are omitted).

If the device finishes testing the test program (yes to 818) prior to the watchdog timer reaching the limit, the watchdog timer is no longer relevant to that device (stage 822). If the watchdog timer is only for that device or that device is the last device monitored by the watchdog timer to complete testing, then the watchdog timer may be turned off at stage 822. Otherwise, the watchdog timer is turned off once all devices monitored by the same watchdog timer have completed testing (provided the watchdog timer has not by then reached the time limit). Whether or not the watchdog timer is turned off after the device has completed testing, the irrelevancy of the watchdog timer to the device may be made evident in one embodiment through the logging of the status of the device as "finished" the test program in stage 822.

Method 800 ends for a device, either when the device finishes testing (stage 816, or 818/820) or after the device is aborted (stage 812 and 814).

In some embodiments, once yield conditions do not allow other devices to be cutoff, for example the Fail Limit has been reached, method 800 may or may not be streamlined for all other devices tested under the same yield conditions, for example against the same Fail Limit. In one of these streamlined embodiments, for example, each test may be processed, executing stages 804, 806, 818 and 820 with all other stages omitted. This streamlined method may be appropriate in some cases if the yield conditions are static and remain as first established for a collection of devices under test, for example the Fail Limit is constant. However in other embodiments, yield conditions may be re-established as testing progresses. Therefore in some of these other embodiments, method 800 continues to be performed on each device, checking if and when a watchdog timer has reached the limit and the device has not completed testing, whether aborting testing on the device is feasible under the yield conditions as currently established (for example under the current Fail Limit).

In one embodiment of method 800, testing progresses to completion, or until the Watchdog Timer triggers, whichever comes first. As an individual device completes the entire test program (for example in a sequential or parallel testing environment), the test status of the device is logged as "finished", for example by test status monitor 410. Once the watchdog timer reaches the limit (yes to 808), any devices under test of the test program which are being monitored by the watchdog timer are polled by station controller 407 to verify that the testing of the devices is complete (yes to 818). For example, it may be checked whether the test status of the device for the test program is "finished" or not. (It should be evident that test status monitor 410 may equivalently log "finished" test status or "unfinished/engaged" test status for use in this embodiment). If a device is found to continue to be engaged in testing at this point, the device has exceeded the specified limit (yes to 808) and is identified as a candidate for test-time cut off elimination. If the cumulative number of devices identified as test-time cut-off candidates in the test operation up to this point is less than or equal to the maximum number of tail cut-off failures allowed, Fail Limit, (no to 810), the aberrant device is designated for termination and for being marked as a failure. If the Fail Limit has been exceeded, however, no action is taken and the aberrant device is allowed to complete testing (816). If the device testing is sequential, then provided the device is not the last to be tested, then after the device has had testing aborted or has completed testing, the next device may be tested. If the test operation is an asynchronous parallel test operation, when all testing within the parallel group has either been completed or terminated, the multi-site parallel test hardware is connected to a fresh set of untested devices to continue testing a new parallel group. Alternatively, if tester resources can be redeployed in the asynchronous parallel environment, then upon aborting of testing on a device or after the device completes the test program, the tester resources (i.e. test-site) being used to test that device can be immediately redeployed to a fresh, untested device within the present touchdown.

In an alternative embodiment, instead of a watchdog timer being set to trigger when a maximum test limit for the test program elapses, a watchdog timer may trigger when the maximum test time for a particular test elapses (for example $tmax_n$ for test #n, or a maximum test time for a plurality of tests but less than all tests in the test program). Upon trigger, it is determined if test #n has been completed for the device (i.e. whether the status for that device for that particular test is "finished"/"engaged", for example as logged by test status monitor 410) or alternatively whether all the tests in the plurality of tests have been completed. If test #n has not been completed (or not all tests in the plurality of tests have been completed), testing is aborted on the device (optionally depending on yield conditions). For example, in a sequential testing environment, once a device has completed all the tests or has had testing aborted using this method, the next device if any can be tested. As another example assuming a parallel environment, a watchdog timer can trigger at a maximum time for each test or at a maximum test time for the plurality of tests (which depending on the embodiment may or may not be the same for each parallel group). Upon triggering, testing on any too slow (aberrant) device(s) may be aborted (or optionally completed depending on yield conditions), prior to allowing testing to move to the next test or plurality of tests, if any, for all non-aborted devices in the parallel group (where there may or may not be a watchdog timer for the subsequent test or plurality of tests). If there are no more tests for the parallel group, then the multi-site parallel test hardware is connected to a fresh set of untested devices to continue testing a new parallel group. Using this method, it may be possible in some embodiments to reduce the rate of testing compared to a parallel test environment without a cut off algorithm. As another example, assuming a parallel testing environment, a watchdog timer for any test or plurality of tests for a device may be reset prior to the test (or the plurality of tests) beginning on that device. In this example, if a device completes a test or the plurality of tests (either because the watchdog timer has not triggered or the Fail Limit has been reached), the device moves to the next test or plurality of tests and a watchdog timer for the next test or plurality of tests is set to trigger when the maximum test time for the next test or plurality of tests has been reached, regardless of the performance of the other devices in the parallel group. In one embodiment of this example where tester resources are redeployed, if a device is aborted or has completed the test program, the tester resources for that device can be redeployed to a fresh, untested device within the present touchdown. In another embodiment of this example where tester resources are not redeployed, then when all the devices in the parallel group have completed the test program or had testing aborted, the multi-site parallel test hardware is connected to a fresh set of untested devices to continue testing a new parallel group. In some embodiments which support multiple watchdog timers for the same test or plurality of tests (and/or a watchdog timer capable of being set to multiple values), each timer may be set to the same or different $tmax_n$ value (or time limit value for the plurality of tests), with each timer applied to a different device or to a different subset of devices. For example in one of these embodiments different $tmax_n$ values (or time limit values for the plurality of tests) may be applied to different subsets of devices, with devices in each subset assumed to respond similarly to testing.

In one embodiment, there may be different values for any of parameters, $tmax_n$, Fail Limit, Tmax, other time related parameter(s), and/or other yield related parameter(s) for different groups of devices (for example in some cases there may be different value(s) for each group of devices assumed to respond similarly to testing). In this embodiment, the timer is set to the $tmax_n$, Tmax and/or other time related parameter value appropriate to the group which includes that device, and/or the failure counter is compared to the Fail Limit or another yield related comparison is made appropriate to the group which includes that device.

FIG. 9 illustrates a method 900 for semiconductor testing with test time tail cut off, according to another embodiment of the present invention. This embodiment is typically although not necessarily applicable in an asynchronous parallel test environment, since the status of devices-under-test is only checked once the first of the devices common to the parallel test group has successfully completed all tests. At that point in time, the test status of all remaining devices-under-test within the parallel test group is checked by the station controller 407 to verify that the devices have progressed to a point in the test program beyond which the remaining test-time required to finish is within the time allowed by the test-time limits. If this is not the case, the testing of the lagging devices may be terminated. Method 900 is therefore executed in parallel for each device in the parallel test group.

Beginning with the first test in the test program, for example test program 412, (stage 902), each test is executed (stage 904) on the device. If the test is completed and no other device in the parallel group has completed the test program (no to stage 906), then the "finished" test status of that test for this device is logged (918), for example by test status monitor 410. If the last test in the test program for this device is completed (yes to 920), then the completion of the test program triggers the checking of whether the testing of any other (too slow testing) devices in the parallel group should be aborted (stage 924), i.e. the answer to stage 906 for method 900 executed on the other devices in the parallel group would then be yes. For example, there may be a watch on whether the final test (or equivalently the test program) has been completed by any of the devices in the parallel group and therefore recognition when the final test is completed by this device. As another example, the test status, for example as logged by test status monitor 410, may be periodically polled to see if any of the devices has completed the test program, and the polling having indicated that this device has completed testing triggers the checking whether any other devices in the parallel group should be aborted.

Depending on the embodiment, a device may be required to pass all tests to complete the test program and if the device fails one test, testing is stopped (i.e. the device is prevented from completing the test program), or the device may be allowed to complete the test program even if the device fails one or more tests or fails one or more predetermined tests. In embodiments where devices are allowed to complete the test program even after failing one or more tests, checking may be triggered on the other devices in the parallel group (906) once a first device completes the test program or once a first device completes the test program having passed all the tests depending on the embodiment.

Returning to stage 906, if on the other hand, another device within the parallel testing group has completed the entire test program (yes to 906), then in stage 908 it is determined if the device is a candidate for having testing aborted, based on anticipated remaining test time. For example, in the illustrated embodiment, the test-time tail cut-off algorithm engine calculates the cumulative typical test-time required to complete the test program by summing the ttyp values of the tests remaining. Continuing with the example, if the last test to have logged a finished status for the device was $test_{n-1}$, for example by test status monitor 410, then the typical test time for each test beginning with test #n and ending with the last test (in the illustration test #z) is summed to give the remaining cumulative typical test-time. In this example, the remaining cumulative typical test time is $$\sum_{i=n}^{z} ttyp_i.$$

In other embodiments, the allowance for the remaining cumulative typical test time may be calculated by other statistical methods of test time summation (as appropriate to the statistics used), rather than by the simple addition of typical test test-time components as shown in FIG. 9. In other embodiments, anticipated remaining test time may be calculated differently (i.e. not using typical test times for remaining tests).

If the remaining cumulative typical test-time for the device at that point exceeds the difference between the maximum total test-time limit for the test program, Tmax, and the typical total test-Time for the test program, Ttyp, the device is identified as a candidate for test-time cut-off elimination (yes to stage 908).

Continuing with the example where the last test to have logged a finished status for the device was $test_{n-1}$ and the last test in the test program is test #z, in one embodiment a device is identified in stage 908 as a candidate for test time cut-off elimination if:

$$\sum_{i=n}^{z} ttyp_i > T_{max} - T_{typ}$$

In other embodiments, as an alternative to such real-time calculations of stage 908, a simple look-up table, based on off-line (non-real-time) theoretical or statistical analysis, may be referenced within the algorithm to determine whether or not there is sufficient time to complete test program execution within the Tmax time limit. That is, based on knowledge of which test is in progress, remaining cumulative test time required for completion may be anticipated, and a decision whether a device is a candidate for test-time tail cut-off can be made.

In some embodiments employing the above alternative of a simple look-up table to determine whether or not to abort the testing of a device, the algorithm illustrated in FIG. 9 may be modified such that the calculations and numerical evaluation shown in stage 908 would be replaced with the extraction from a look-up table of a predefined device disposition (i.e. treatment) associated with the specific test-in-progress (test #n, as illustrated), for example indicating whether the device executing test #n is to be treated as a test-time tail cut-off candidate or not. In the context of the algorithm shown in FIG. 9, when arriving at a point in time when at least one device in the parallel group has completed the entire test program (when arriving at stage 908), the test status of a lagging device in the parallel group is used as the basis for how the device is to be treated. For example in one embodiment the look up table may include for each test in the test program, a predefined indication of whether a device currently having that test applied should be considered a candidate for test-time tail cut-off (test aborting) or is progressing quickly enough that the device should be allowed to complete the test program uninterrupted. As another example in another embodiment, the look up table may include for each test in the test program, additionally or alternatively, other indications, for example device having that test applied is lagging behind, device having that test applied is on track to complete test program in good time, etc. In another embodiment the look up table may include entries for less than all tests in the test program. For example the look up table may only include entries for tests where a device undergoing any of those tests is considered a candidate for test aborting, and if the test which a device is undergoing is not listed, the device is not a candidate for test aborting.

If the device is not a candidate for test time tail cut off (no to stage 908), testing on the device is continued until the device completes the test program (stage 910), and method 900 ends for this device. Alternatively, in other embodiments if prior to the device completing the test program a predetermined number of devices in the parallel group completed testing, stage 908 may be recalculated for the remaining tests to determine if the device is now a candidate for test time tail cut off. For example in some of these other embodiments, stage 918 and following stages may be executed after a no in stage 908 instead of stage 910. In one of these other embodiments, there may an updated recalculation of stage 908 for the device each time another device in the parallel test group completes the test program (yes to 906) prior to the device completing the test program.

If the device is a candidate for test time tail cut off (yes to 908), then in some embodiments, yield monitor data (for example from yield monitor 411) is compared by algorithm engine 405 to one or more yield limits in stage 912. For example, in one of these embodiments it may be determined whether cutting off the testing of the current too slow-testing device would cause the total number of devices cut off to exceed the maximum number of too slow-testing devices allowed to be cut-off (i.e. Fail Limit). If cutting off testing on the device would cause the yield limit to be exceeded, then the incomplete test for that device, if any, is completed as well as any remaining tests in the test program (stage 910). If on the other hand cutting off the device would not cause the limit to be exceeded, then a decision is made to terminate the testing on device and mark the device as bad (stage 914). For example test abort signal 406 may be asserted to interrupt testing. A counter (for example in yield monitor 411) keeping track of the number of devices designated for cut off is incremented (stage 916), taking into account the device designated for aborting in stage 914. In another embodiment, yield criteria are not taken into account and stage 914 directly follows a yes to stage 908 prior to method 900 ending (i.e. stage 912 and 916 are omitted).

Figure 10:
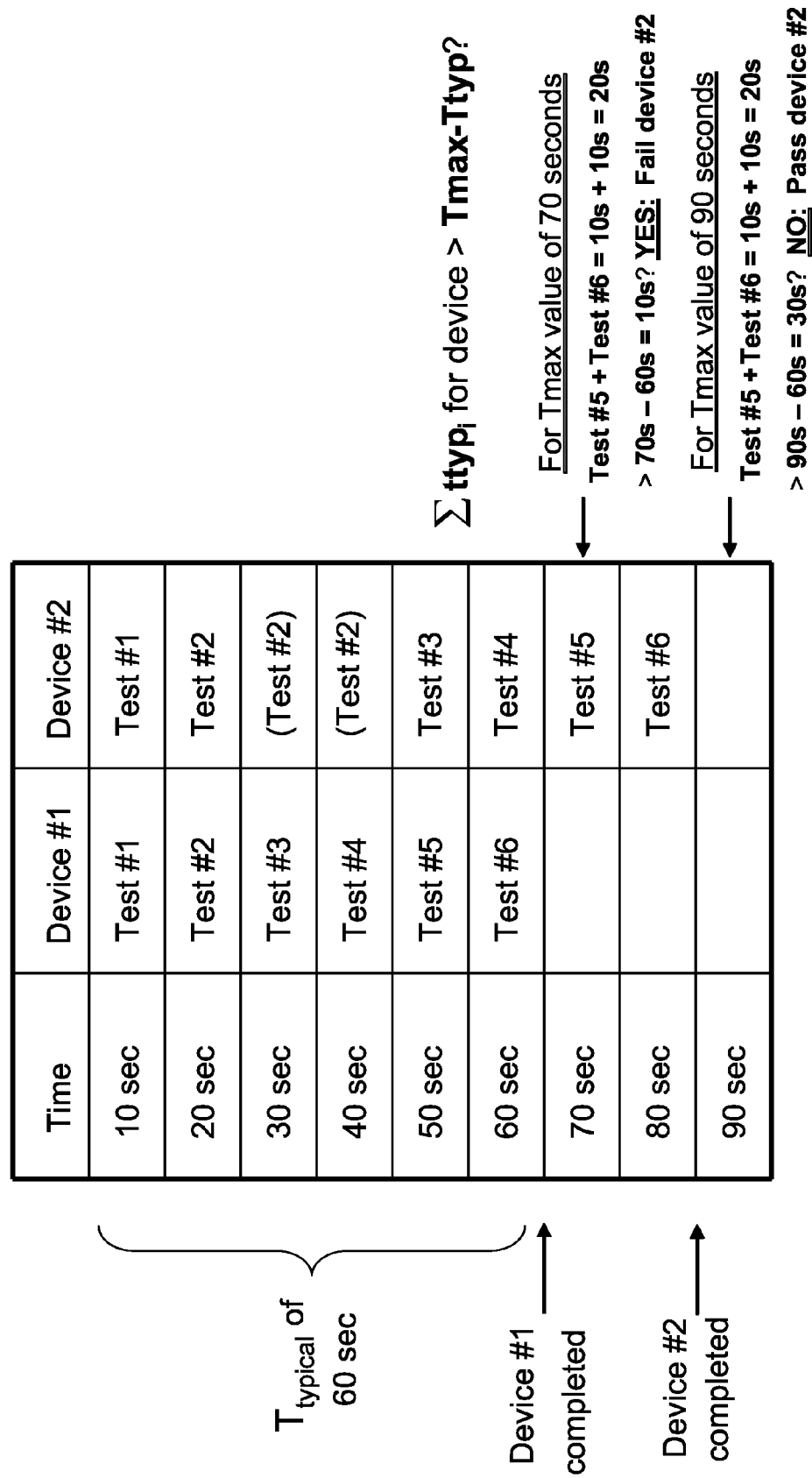
FIG. 10 is an illustration of an example of testing using the method of FIG. 9.

To further illustrate method 900 of FIG. 9, an example of the algorithm is shown in FIG. 10. The test-times of an illustrative test program of two devices, Device#1 and Device#2, are shown side-by-side. The test program contains a total of six tests, each test with a typical test-time $ttyp_n$ of 10 seconds. Device#1 completes the six tests in a normal test-time of 60 seconds (6×10 seconds), while Device#2 takes 20 seconds longer, due to an abnormally long test time of 30 seconds for execution of test #2. Given these data, the algorithm above is compared for two different Tmax limits: the first equaling 70 seconds and the second equaling 90 seconds. The Ttyp value for this product is assumed in this example to be equal to 60 seconds, in this case the same as the actual test-time required for Device#1 to complete testing. As seen in the figure, when Device#1 completes testing, Device#2 still needs to complete execution of Test #5 and Test #6, requiring a total of 20 seconds (assuming normal test-times for these two tests). Assume as above the mathematical query whether or not the remaining cumulative typical test times (in this example Test #5 and Test #6) is greater than the difference between the maximum test limit for the test program and the typical test time for the test program i.e.

$$\sum_{n=5}^{6} ttyp_n > T_{max} - T_{typ}$$

In the case of a Tmax value of 70 seconds, there will not be enough time to complete the remaining tests on Device#2 after Device#1 has finished testing, and therefore Device#2 is immediately identified as aberrant (i.e. (10 sec+10 sec) is greater than (70 sec−60 sec)). However, in the case of a Tmax value of 90 seconds, there will be enough time to complete the two remaining tests (i.e. (i.e. (10 sec+10 sec) is less than (90 sec−60 sec)), and Device#2 will be allowed to continue testing to completion.

In some embodiments, there may be subsets of devices, for example with each subset assumed to respond similarly to testing. In some of these embodiments stage 906 may be applied without differentiating between the different subsets, i.e. the first device belonging to any subset triggers the checking of stage 908 for all other devices in the parallel group. In one of these embodiments, the checking of stage 908 for a device in a particular subset involves the remaining cumulative typical test time, the maximum total test-time limit, Tmax, and the typical total test-Time, Ttyp any of which may be customized to the subset, whereas in another of these embodiments, the checking of stage 908 for a device in a particular subset involves non-customized cumulative typical test time, Tmax, and Ttyp. In another of these embodiments, stage 906 is applied independently to each subset, i.e. the first device in a particular subset triggers the checking of stage 908 for all other devices in that particular subset. Stage 912 may in one of these embodiments use a different test time tail cut off failure counter and Fail Limit depending on the subset, whereas in another of these embodiments, the same failure counter and Fail Limit may be used for all subsets. Similarly in another embodiment stage 912 may make a yield related comparison which is dependent or independent of which subset includes the device.

The algorithms described above may be combined in various embodiments, for example in order to detect aberrant devices at multiple points during test execution, aborting testing on aberrant devices at any of these points in the test program, optionally up to the number given by Fail Limit. For example, in one embodiment of a parallel testing environment, devices with aberrant test time could be identified both by examining test-time limits for individual tests as testing progresses, as well as by examination of progress through the test program at the point when a first fully-tested passing device within the parallel testing group completes testing.

In the description above of stages 710, 812, and 914, a decision is made to terminate the testing on a too slow-testing device. Depending on the embodiment, the actual termination of the testing may occur as soon as possible after the decision is made, or may be postponed for any reason such as implementation logistics. For example, in one embodiment where there is parallel group testing without redeployment of tester resources, it may be simpler in some cases to wait until right before all devices in the parallel group (not designated for termination) have completed testing and abort any and all devices designated for termination at the same time. As another example, if a decision to abort testing on device is made in the middle of a test, it may be easier in one embodiment to allow the device to complete the test (but not the complete test program) prior to aborting the device. In these examples it should be recognized that the too slow testing device is not allowed to complete testing (i.e. complete the test program) prior to being aborted. In one embodiment, if the device whose testing is to be aborted is being tested in a parallel group without redeployment of tester resources, the aborting of device testing occurs early enough so that once all devices in the parallel group which are allowed to complete the test program have completed the test program, testing can proceed to the next parallel group (without any delay being caused by device whose testing is being aborted). In one embodiment the incrementing of the tail cut off failure counter in stage 712, 814 and 916 can be performed when the decision to abort testing is made even though there may be a time lag until actual test aborting takes places.

In the description and illustrations of FIGS. 7, 8, 9, for simplicity's sake, the possibility of a device failing one or more tests and therefore being prevented from completing the test program is not explicitly mentioned. This possibility however may be integrated into some embodiments of methods 700, 800 and/or 900. For example, after each test #n is completed (for example in stage 704, 816,818, 910, 918) it may be determined whether test #n was passed (or in some of these embodiments it may be determined whether test #n was passed or the failure of test #n does not prohibit proceeding with the test program). If test #n was failed (or in some of these embodiments if the failure of test #n prohibits proceeding with the test program), then testing ends for the device. In some embodiments, devices which do not complete the test program due to failing one or more tests may be tracked, for example as L described above. In one of these embodiments, L may impact on the setting of parameters for the tail cut off algorithm, for example raising maximum test time limit setting(s) and/or lowering the Fail Limit parameter setting if L exceeds a predetermined value, in order to compensate for the yield loss from L.

In addition, for simplicity's sake the above description of 700, 800 and 900 did not explicitly mention which simultaneous candidates for test aborting should be aborted if not all candidates can have testing aborted without exceeding the Fail Limit value. Depending on the embodiment, any suitable criteria may be used for determining which candidates have testing aborted and which candidates are retained so as to not exceed the Fail Limit value.

Some embodiments of the invention contemplate aborting the testing of a too slow-testing device so that testing on any untested devices can proceed without waiting for the too slow-testing device to complete testing. Thus, these embodiments provide a different approach than delaying the testing of other devices due to the too slow-testing of a given device. In one of these embodiments, testing on at least one untested device proceeds immediately after aborting testing on the too slow-testing device. In another of these embodiments, there is a time gap between the test aborting on the too slow testing device and proceeding to testing an untested device. For example, the time gap may arise from the requirement in some embodiment to wait until other devices in the same parallel group as the too slow testing device have completed testing.

It was already mentioned that in some embodiments there may be no comparison of yield monitor data to yield parameters and as long as a device is a candidate for test time cutoff due to excessive test time, the device is cut off (i.e. if a device is a candidate then the corollary is that the device will be cut off). The above described algorithms compared the number of too slow testing devices whose testing has been cut off to a predetermined value of the Fail Limit parameter for ease of explanation. However, in other embodiments, other approaches for comparing yield may be used. For example, in one embodiment, if the monitored number of passing devices is above a predetermined yield minimum, then a candidate for test cut off may be aborted. As another example, in one embodiment, if the total number of devices that had testing aborted because of too slow testing or failed for another reason is below a predetermined total failure maximum, then a candidate for test cut off may be aborted. As another example, combinations of the above are possible, i.e. if monitored data is above/below any of two or more predetermined parameter values then a candidate may be aborted, or if monitored data is above/below all of two or more parameter values then a candidate may be aborted. As another example, in one embodiment a test time tail cut off algorithm may watch out for a specific condition or conditions, for example when the number of too slow testing devices whose testing has been cut off reaches the predetermined Fail Limit value, the monitored passing devices falls below a predetermined yield minimum value, and/or the total monitored number of devices that had testing aborted because of too slow testing or failed for another reason reaches a predetermined total failure maximum. In this example when the algorithm recognizes the condition(s) further test aborting is barred as long as these condition(s) prevail.

It should also be recalled that as explained above devices marked as bad (for example in stage 710, 812 or 914) may be discarded, or an attempt may be later made to salvage the device, etc depending on the embodiment.

It will now be briefly explained how data generated by the evaluation of a test time tail cut off algorithm may be used in some embodiments for purposes other than determining whether to abort testing of too-slow testing device(s). For example, a record of each cut-off event (i.e. where a too-slow testing device is determined to be a candidate for aborting testing) could be compiled in a summary report of some kind. The report might indicate any of the following inter-alia: the number of devices that were candidates for test-time tail cut-off, broken down per-test, per-wafer, per-lot, and/or possibly per tester equipment set. In some of these embodiments, the number of devices may be trended, and the trend chart could be analyzed with commonly used Statistical Process Control techniques, optionally with the capability of triggering an alarm. For example, if a particular piece of test equipment were determined to be systematically producing a greater number of test-time cut-off candidate devices than the other equipment sets in use on the test floor, in one of these embodiments an automated alarm or problem report would result. As another example, the rate of test-time cut-off failures may be found to be increasing with time after a certain fabrication process date. In this example, an automated alarm or problem report might be generated. As another example, there may be embodiments where once the number of devices whose testing has been aborted reaches the Fail limit (and no subsequent devices that are candidates for test time tail cut off may have testing aborted), there may be a count of how many subsequent devices did not have testing cut off because the Fail limit had already been reached and if the count reaches another predetermined number, one or more actions may be taken, for example causing an automated alarm or problem report, discarding the collection of devices under test, and/or discarding part of the collection, etc. The invention is not limited to specific uses, if any, of data generated during evaluation of a test time tail cut off algorithm nor by particular reports, alarms or other actions, if any, resulting from the data.

Figure 11:
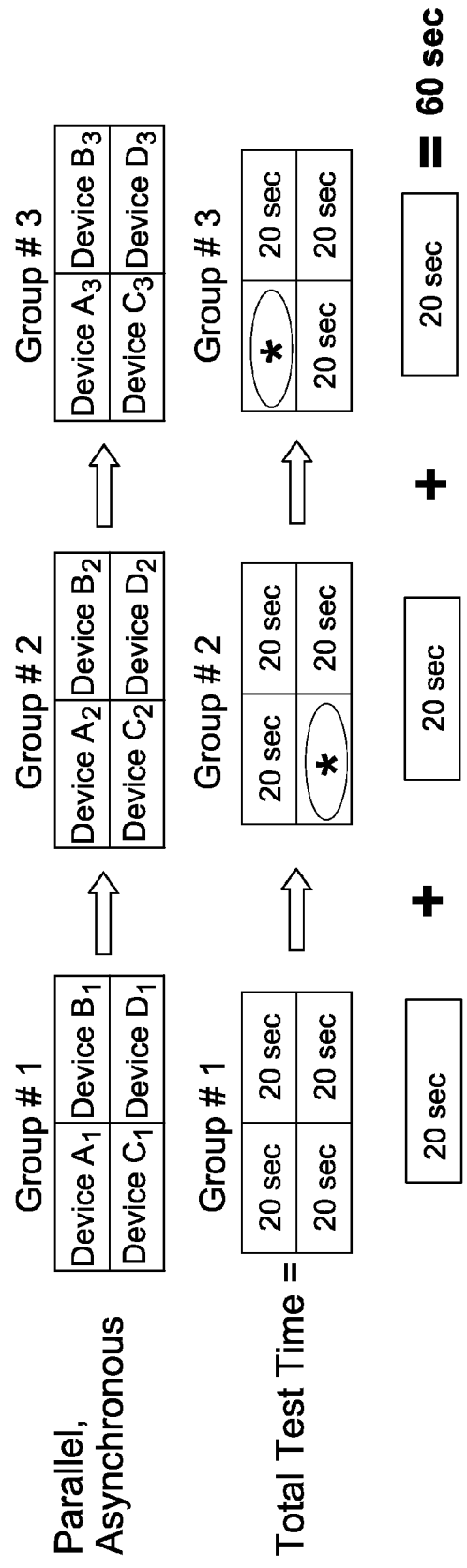
FIG. 11 is an illustration of the reduction of total test time when the testing of too-slow testing devices is aborted according to an embodiment of the present invention, compared to the example of FIG. 3.

In order to further illustrate a potential benefit of one embodiment of the current invention, refer to FIG. 11. FIG. 11 illustrates a benefit of one embodiment of the invention, as applied in an asynchronous parallel test configuration. In this example, four devices are being tested in parallel with a typical test time of 20 seconds for normal devices and therefore a typical test time Ttyp of 20 seconds in any parallel group that contains only normal devices, as seen in Group #1. Device $C_2$ in Group #2 and device $A_3$ in Group #3 represent aberrant devices whose test times are determined to be excessive compared to the 20 second test time of the other devices and have therefore had testing aborted, preventing their testing from limiting the test time of these two parallel groups. With this method, test time remains at 20 seconds for each of the three parallel groups, at a cost of the loss of the two aberrant devices (assuming the aberrant devices are discarded).

Figure 12:
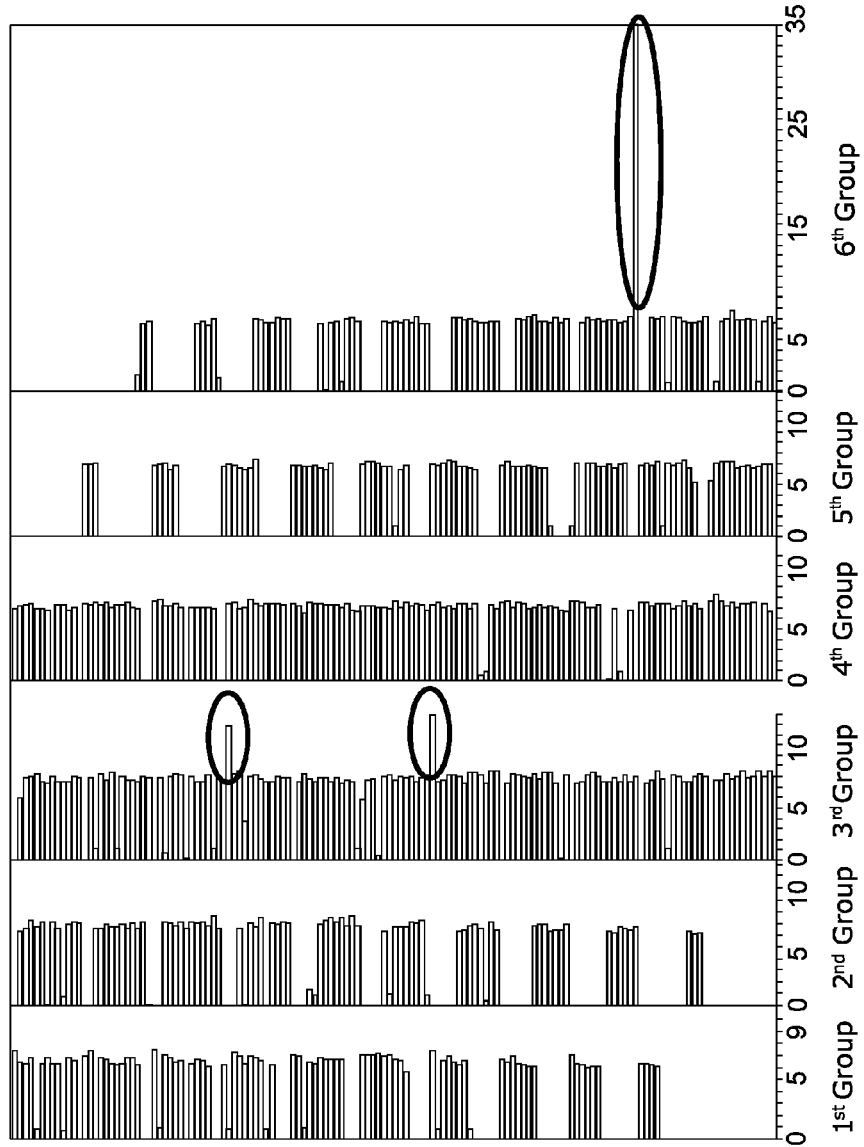
FIG. 12 is an illustration of test time data from testing several devices in a sequence of parallel test groups in an asynchronous parallel test environment.

A potential benefit of one embodiment of the invention may be seen with reference to FIG. 12. FIG. 12 shows the test-time for a series of six consecutive parallel groups on a wafer, in which the test-time tails are not being eliminated. The horizontal bars shown in each parallel group represent individual devices, whose test-time is given by the length of the bar. Three aberrant devices with unusually long test-times can be seen in the third and the sixth parallel groups, responsible for roughly 33% of the total test-time for the six parallel groups, effectively reducing test efficiency by the same percentage. Terminating the testing of the abnormal devices in these two parallel groups, rather than allowing them to test to completion, would therefore reduce overall test-time by roughly this amount.

Figure 13:
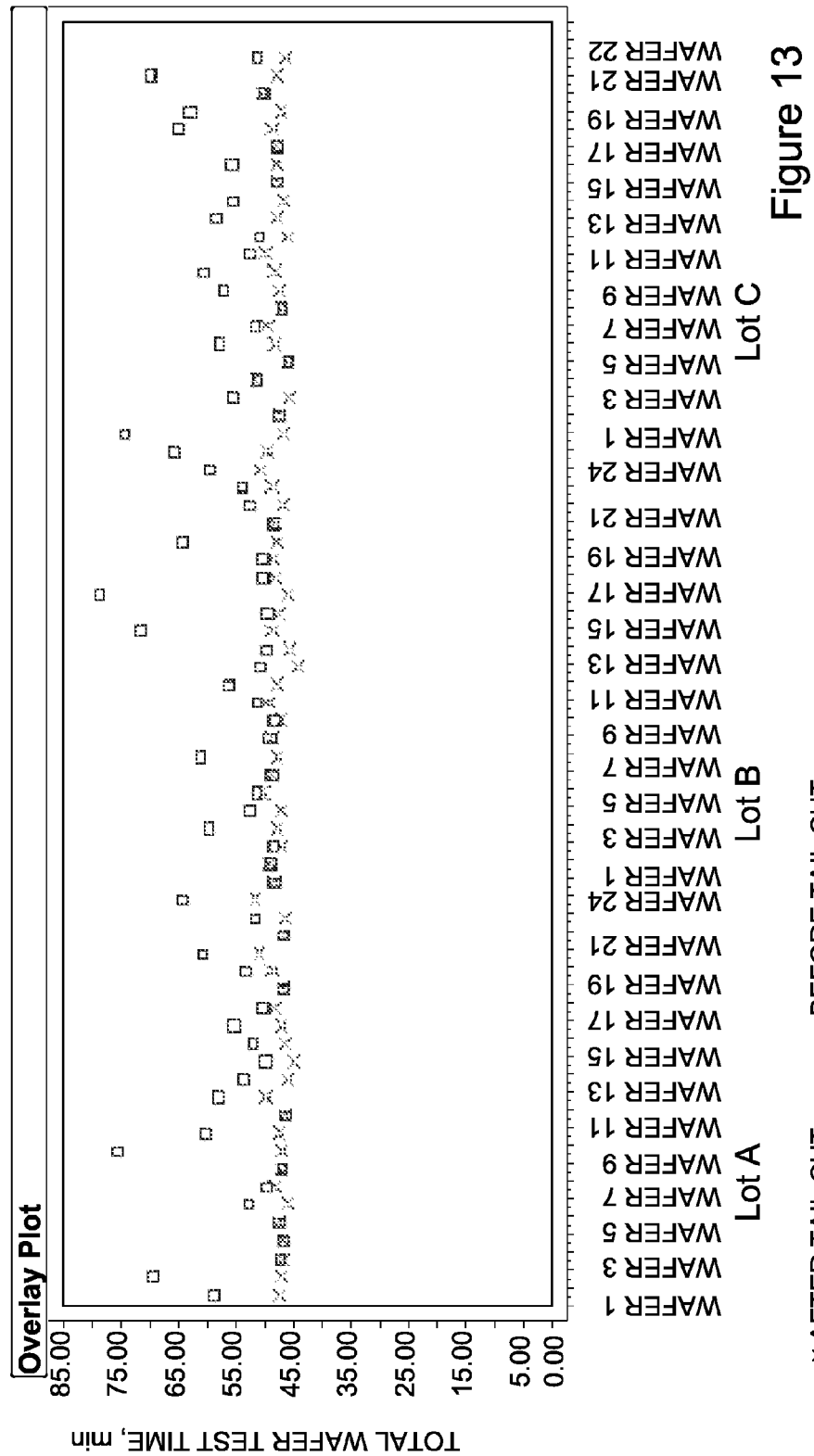
FIG. 13 illustrates a comparison example of wafer test times when the testing of too-slow testing devices is or is not aborted, in an asynchronous parallel test environment, according to an embodiment of the present invention.

A benefit of one embodiment of the invention on a large volume of material is illustrated by FIG. 13. FIG. 13 shows the wafer-level test-time for a series of wafers, in minutes, with and without application of a test-time tail cut-off method in an asynchronous parallel test environment, according to an embodiment of the present invention. It can be seen that the variation in wafer-level test-time is substantially reduced when a test-time tail cut-off method is applied, reducing the original test-time range of 45 to 80 minutes to a much lower and narrower range of 45 to 50 minutes after test-time tails are eliminated.

The reader should understand that the potential benefits illustrated by FIGS. 11, 12, and 13 are not necessarily typical nor are these types of benefits required for all embodiments of the invention. There may be embodiments of the invention where the benefit(s) are greater, less or different than those described herein. It should also be understood that there may be implementations where the invention provides little or no benefit.

In one embodiment, the testing environment is to a sequential test environment, for example in which aberrant devices with unusually long test times exist. In another embodiment, the testing environment is a parallel test environment. In some cases the benefit of applying a test time tail cut off algorithm may vary depending on whether the testing environment is sequential or parallel. For example there may be cases when the benefit(s) are greater in the parallel environment. The invention however is not limited only to testing environments where benefits) are necessarily greater or the greatest.

In some cases, the application of a test time tail cut off algorithm may provide a greater benefit in a testing environment where test times are more variable, however the invention is not limited to implementations where test times are more variable or even to implementations where test times are necessarily variable.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

While the invention has been shown and described with respect to particular embodiments, it is not thus limited. Numerous modifications, changes and improvements within the scope of the invention will now occur to the reader.

The invention claimed is:

1. A method of semiconductor testing comprising:
while a test program is being applied to a semiconductor device, deciding that said device is testing too slowly and that based on a yield criterion said device is to be prevented from completing said test program; and
preventing said device from completing said test program;
wherein after said device has been prevented from completing said test program and if there is at least one remaining untested semiconductor device, said test program is applied to at least one of said remaining untested semiconductor devices.

2. The method of claim 1, wherein said deciding includes:
checking whether the number of devices which tested too slowly and were previously designated for being prevented from completing said test program is less than a maximum allowed number of such devices, and
if less than said maximum, deciding that based on a yield criterion said device is to be prevented from completing said test program.

3. The method of claim 1, wherein said deciding includes:
checking whether the number of devices which passed said test program is more than a predetermined minimum desired number of passing devices; and
if more than said minimum, deciding that based on a yield criterion said device is to be prevented from completing said test program.

4. The method of claim 1, wherein said deciding includes:
checking whether the number of devices which were previously designated for being prevented from completing said test program for any reason is less than a maximum allowed number of such devices; and
if less than said maximum, deciding that based on a yield criterion said device is to be prevented from completing said test program.

5. The method of claim 1, wherein said deciding includes:
checking whether at least two conditions apply selected from a group comprising: the number of devices which tested too slowly and were previously designated for being prevented from completing said test program is less than a maximum allowed number of such devices, the number of devices which passed said test program is more than a predetermined minimum desired number of passing devices, and the number of devices which were previously designated for being prevented from completing said test program for any reason is less than a maximum allowed number of such devices; and
if said at least two conditions apply, deciding that based on a yield criterion said device is to be prevented from completing said test program.

6. The method of claim 1, further comprising:
customizing said yield criterion based on at least one test factory condition.

7. The method of claim 6, wherein said customizing includes:
increasing a maximum number of devices allowed to be prevented from completing said test program because of testing too slowly in order to attempt to increase a number of devices on which said test program is applied in a predetermined time period.

8. The method of claim 6, wherein said customizing includes:
decreasing a maximum number of devices allowed to be prevented from completing said test program because of testing too slowly in order to attempt to increase a number of devices which pass said test program.

9. The method of claim 1, wherein said deciding includes:
recognizing that said device is testing too slowly because at least one test time for applying at least one test in said test program to said device exceeds at least one maximum test time for said at least one test.

10. The method of claim 1, wherein said deciding includes:
recognizing that said device is testing too slowly based on data relating to a plurality of tests in said test program.

11. The method of claim 1, wherein said deciding includes:
recognizing that said device is testing too slowly because said device has not completed at least one test when a maximum test time for said at least one test has elapsed.

12. The method of claim 1, wherein said deciding includes: recognizing that said device is testing too slowly compared to at least one other device being tested in parallel.

13. The method of claim 1, wherein said test program is applied to said device at a separate time from any other device.

14. The method of claim 1, wherein said test program is applied in parallel to said device and to at least one other device in a parallel group.

15. The method of claim 1, wherein said device prevented from completing said test program is discarded.

16. The method of claim 1, wherein said device prevented from completing said test program is retested at a later time.

17. The method of claim 1, wherein said deciding includes: recognizing that said device is testing too slowly based on a customized value for a test time parameter.

18. A non-transitory computer program product comprising a non-transitory computer useable medium having computer readable program code embodied therein for semiconductor testing, the computer program product comprising:

computer readable program code for causing the computer, while a test program is being applied to a semiconductor device, to decide that said device is testing too slowly and that based on a yield criterion said device is to be prevented from completing said test program; and computer readable program code for causing the computer to prevent said device from completing said test program;

wherein after said device has been prevented from completing said test program and if there is at least one remaining untested semiconductor device, said test program is applied to at least one of said remaining untested semiconductor devices.

* * * * *